(12) United States Patent
Choi et al.

(10) Patent No.: US 12,322,663 B2
(45) Date of Patent: Jun. 3, 2025

(54) DISPLAY DEVICE AND METHOD OF FABRICATING THE SAME

(71) Applicant: Samsung Display Co., Ltd., Yongin-si (KR)

(72) Inventors: Deok Jun Choi, Yongin-si (KR); Hyo Jung Kim, Yongin-si (KR); Ki Yong Park, Yongin-si (KR); Yoo Young Park, Yongin-si (KR); Hye Sun Sung, Yongin-si (KR); Ji Hyeon Son, Yongin-si (KR); Seung Bo Shim, Yongin-si (KR); Jeong Yong Lee, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 18/532,105

(22) Filed: Dec. 7, 2023

(65) Prior Publication Data
US 2024/0379465 A1    Nov. 14, 2024

(30) Foreign Application Priority Data
May 10, 2023   (KR) .................. 10-2023-0060568

(51) Int. Cl.
*G09G 3/3291* (2016.01)
*G09G 3/3258* (2016.01)
(Continued)

(52) U.S. Cl.
CPC ........... *H01L 22/20* (2013.01); *G09G 3/3258* (2013.01); *G09G 3/3291* (2013.01);
(Continued)

(58) Field of Classification Search
CPC .. H01L 22/20; H10K 59/1201; G09G 3/3258; G09G 3/3291; G09G 2300/0852; G09G 2354/00; G09G 2330/12
See application file for complete search history.

(56) References Cited

U.S. PATENT DOCUMENTS

| 2015/0145850 A1* | 5/2015 | Rohatgi ................. G09G 3/006 345/212 |
| 2015/0221694 A1* | 8/2015 | Baba ................. H01L 27/14636 257/443 |

FOREIGN PATENT DOCUMENTS

| KR | 10-0651918 B1 | 12/2006 |
| KR | 10-0816271 B1 | 3/2008 |

(Continued)

*Primary Examiner* — Robert J Michaud
(74) *Attorney, Agent, or Firm* — Womble Bond Dickinson (US) LLP

(57) ABSTRACT

A method includes: forming a MOSFET layer on a semiconductor wafer substrate, the MOSFET layer including: pixel driver circuits; and a display driver circuit; forming at least one line layer on the MOSFET layer; applying a first supply voltage to a first supply voltage line through a first supply voltage pad; connecting data fan-out lines connected to the pixel driver circuits with a first test line by controlling a test switching circuit in the MOSFET layer; measuring an electrical signal generated from each of the pixel driver circuits through a first test pad connected to the first test line; determining whether each of the pixel driver circuits is defective or not based on the measured electrical signal; and forming a light-emitting element layer including light-emitting elements on the at least one line layer when that the pixel driver circuits are determined to be not defective.

20 Claims, 13 Drawing Sheets

(51) Int. Cl.
*H01L 21/66* (2006.01)
*H10K 59/12* (2023.01)

(52) U.S. Cl.
CPC . *H10K 59/1201* (2023.02); *G09G 2300/0426* (2013.01); *G09G 2300/0852* (2013.01); *G09G 2310/0264* (2013.01); *G09G 2330/12* (2013.01); *G09G 2354/00* (2013.01)

(56) References Cited

FOREIGN PATENT DOCUMENTS

KR  10-2019-0075799 A  7/2019
KR  10-2270632 B1  6/2021

\* cited by examiner

DISPLAY DEVICE AND METHOD OF FABRICATING THE SAME

CROSS-REFERENCE TO RELATED APPLICATION

The present application claims priority to and the benefit of Korean Patent Application No. 10-2023-0060568, filed on May 10, 2023, in the Korean Intellectual Property Office, the entire disclosure of which is incorporated by reference herein.

BACKGROUND

1. Field

Aspects of embodiments of the present disclosure relate to a display device, and a method of fabricating the display device.

2. Description of the Related Art

A wearable device is being developed in the form of glasses or a helmet, and forms a focus at a location close to the user's eyes. For example, the wearable device may be a head mounted display (HMD) device or augmented reality (AR) glasses. Such wearable devices provide users with an augmented reality (hereinafter referred to as "AR") screen or a virtual reality (hereinafter referred to as "VR") screen.

A wearable device, such as the HMD device and the AR glasses, may have display specifications of at least 2,000 PPI (pixels per inch) to allow users to use it for a long time without dizziness. As such, organic light-emitting diode on silicon (OLEDoS) technology is emerging, which is used to manufacture a high-resolution small organic light-emitting element display device. According to the OLEDOS technology, organic light-emitting diodes (OLED) are deposited on a semiconductor wafer substrate on which a complementary metal oxide semiconductor (CMOS) is disposed.

The above information disclosed in this Background section is for enhancement of understanding of the background of the present disclosure, and therefore, it may contain information that does not constitute prior art.

SUMMARY

One or more embodiments of the present disclosure are directed to a display device including switching elements to detect defects of pixel driver circuits disposed on a semiconductor wafer substrate, and a method of fabricating the display device.

According to one or more embodiments of the present disclosure, a display device includes: a display panel including: a display area including a light-emitting element; a non-display area outside the display area; a semiconductor wafer substrate; a metal oxide semiconductor field effect transistor (MOSFET) layer on the semiconductor wafer substrate, and including: a pixel driver circuit configured to drive the light-emitting element; and a display driver circuit configured to control the pixel driver circuit; at least one line layer on the MOSFET layer, and including: a first supply voltage line, a second supply voltage line, gate lines, and a data line connected to the pixel driver circuit; gate fan-out lines in the non-display area, and connecting the gate lines with gate pads connected to a gate driver of the display driver circuit; a data fan-out line in the non-display area, and connecting the data line with a data pad connected to a data driver of the display driver circuit; a first supply voltage pad in the non-display area, and configured to supply a first supply voltage to the first supply voltage line; a second supply voltage pad in the non-display area, and configured to supply a second supply voltage to the second supply voltage line; a first test line in the non-display area, and connected to the data fan-out line by a switching operation of a test switching circuit, and a first test pad in the non-display area, and connected to the first test line; and a light-emitting element layer on the at least one line layer, and including the light-emitting element configured to be driven by the pixel driver circuit.

In an embodiment, the test switching circuit may be configured to be driven during a period of testing the pixel driver circuit.

In an embodiment, during the period of testing the pixel driver circuit, the pixel driver circuit may be configured to receive the first supply voltage through the first supply voltage line, the pixel driver circuit may be configured to receive gate signals at a gate-on voltage through the gate lines, and the data fan-out line may be configured to be connected to the first test line by the switching operation of the test switching circuit.

In an embodiment, during the period of testing the pixel driver circuit, the first test pad may be configured to transmit a current of the first test line or a voltage of the first test line to an external device.

In an embodiment, the test switching circuit may include: a first switching element connected to the data fan-out line, and configured to connect or disconnect between the data fan-out line and the data line; and a second switching element configured to connect a source node connected to the data fan-out line to either an output terminal of the data driver or the first test line.

In an embodiment, each of the first switching element and the second switching element may include at least one MOSFET in the MOSFET layer.

In an embodiment, the pixel driver circuit may include: a first transistor including a gate electrode connected to a first node, a source electrode connected to the first supply voltage line, and a drain electrode connected to a second node; a second transistor including a gate electrode connected to a first gate line from among the gate lines, a source electrode connected to the data line, and a drain electrode connected to the first node with a first capacitor therebetween; a third transistor including a gate electrode connected to a second gate line from among the gate lines, a source electrode connected to the second node, and a drain electrode connected to the first node; a fourth transistor including a gate electrode connected to an emission control line, a source electrode connected to the second node, and a drain electrode connected to a third node connected to the light-emitting element; a fifth transistor including a gate electrode connected to a third gate line, a source electrode connected to the third node, and a drain electrode connected to a third supply voltage line; and a second capacitor between the first supply voltage line and the first node.

In an embodiment, each of the first to fifth transistors may be a p-type MOSFET.

In an embodiment, the third supply voltage line may be configured to receive a ground potential while the display panel displays images.

In an embodiment, the at least one line layer of the display panel may further include: a second test line in the non-display area, and connected to the third supply voltage line by the switching operation of the test switching circuit; and a second test pad in the non-display area, and connected to the second test line.

In an embodiment, the test switching circuit may further include a third switching element configured to connect the third supply voltage line to either the ground potential or the second test line.

In an embodiment, the third switching element may be configured to connect the third supply voltage line with the second test line, and the second test line may be configured to receive a reference voltage different from the ground potential during the period of testing the pixel driver circuit.

In an embodiment, the test switching circuit may further include a fourth switching element connected to the third supply voltage line, and configured to connect or disconnect between the third supply voltage line and the second test line.

In an embodiment, the at least one line layer of the display panel may further include: a second test line in the non-display area, and connected to the third supply voltage line; and a second test pad in the non-display area, and connected to the second test line.

In an embodiment, during the period of testing the pixel driver circuit, the second test line may be configured to receive a reference voltage having a level different from that of the ground potential through the second test pad, and the second test line may be configured to be connected to the ground potential through the second test pad while the display panel displays images.

According to one or more embodiments of the present disclosure, a method of fabricating a display device, includes: forming a MOSFET layer on a semiconductor wafer substrate, the MOSFET layer including: pixel driver circuits to drive light-emitting elements; and a display driver circuit to control the pixel driver circuits; forming at least one line layer on the MOSFET layer; applying, by a power supply of a test apparatus, a first supply voltage to a first supply voltage line through a first supply voltage pad; connecting data fan-out lines connected to the pixel driver circuits with a first test line by controlling a test switching circuit in the MOSFET layer by a switching circuit of the test apparatus; measuring, by a measuring circuit of the test apparatus, an electrical signal generated from each of the pixel driver circuits through a first test pad connected to the first test line; determining, by a controller of the test apparatus, whether each of the pixel driver circuits is defective or not based on the measured electrical signal; and forming a light-emitting element layer including the light-emitting elements on the at least one line layer when that the pixel driver circuits are determined to be not defective.

In an embodiment, the at least one line layer may include: a first supply voltage line, a second supply voltage line, gate lines, and data lines connected to the pixel driver circuits; gate fan-out lines in a non-display area, and connecting the gate lines with gate pads connected to a gate driver of the display driver circuit; the data fan-out lines in the non-display area, and connecting the data lines with data pads connected to a data driver of the display driver circuit; a first supply voltage pad in the non-display area, and supplying a first supply voltage to the first supply voltage line; a second supply voltage pad in the non-display area, and supplying a second supply voltage to the second supply voltage line; a first test line in the non-display area, and connected to the data fan-out lines by a switching operation of a test switching circuit; and a first test pad in the non-display area, and connected to the first test line.

In an embodiment, the electrical signal may include a voltage or a current generated from each of the pixel driver circuits.

In an embodiment, the test switching circuit may include: a first switching element connected to each of the data fan-out lines, and configured to connect or disconnect between the data fan-out lines and the data lines; and a second switching element configured to connect a source node connected to each of the data fan-out lines to either an output terminal of the data driver or the first test line.

In an embodiment, each of the first switching element and the second switching element may include at least one MOSFET in the MOSFET layer.

According to one or more embodiments of the present disclosure, in a process of inspecting defects on a semiconductor wafer substrate (e.g., an electrical die sorting (EDS) process) in a display device, it may be possible to check for (e.g., determine) defects on a display driver circuit and defects on a pixel driver circuit disposed on the semiconductor wafer substrate, so that a repair may be easily performed, and the yield may be increased.

However, the aspects and features of the present disclosure are not restricted to those set forth herein. The above and other aspects and features of the present disclosure will become more apparent to those having ordinary skill in the art by referencing the detailed description of the present disclosure given below and the drawings.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
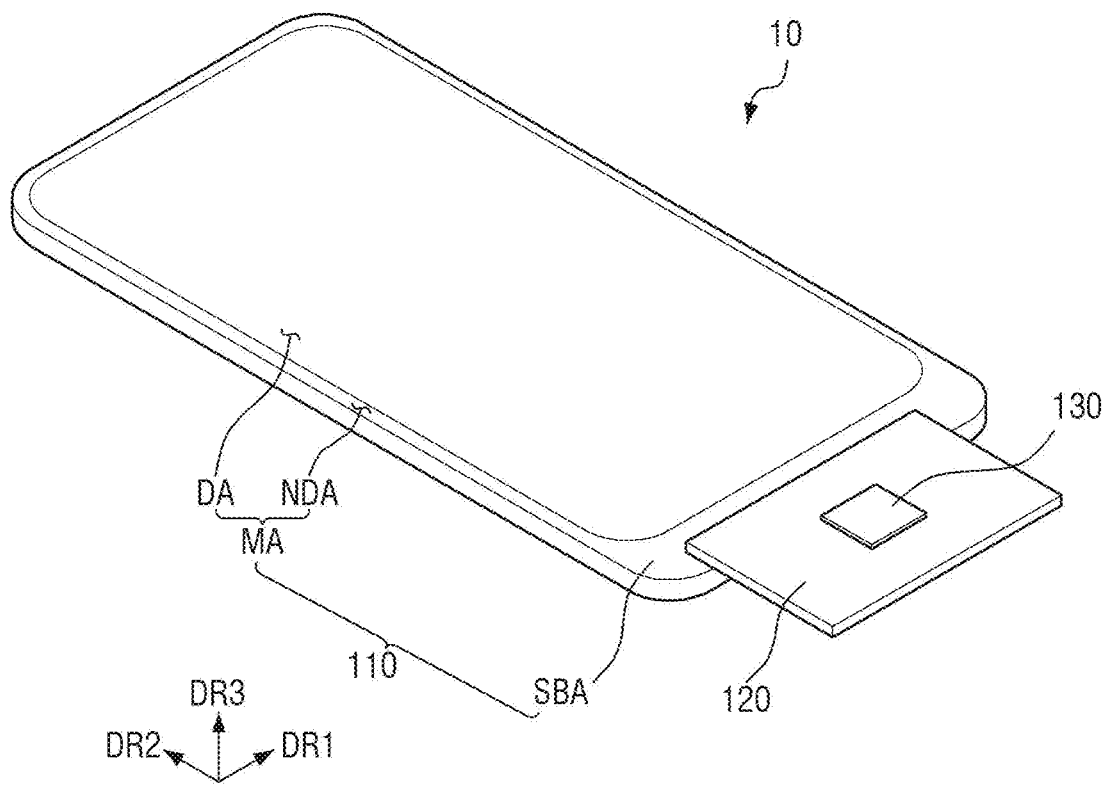
FIG. 1 is a perspective view showing a display device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view showing a display device according to an embodiment of the present disclosure.

Referring to FIG. 1, a display device 10 may be employed by portable electronic devices, such as a mobile phone, a smart phone, a tablet PC, a mobile communications terminal, an electronic notebook, an electronic book, a portable multimedia player (PMP), a navigation device, and an ultra-mobile PC (UMPC). For example, the display device 10 may be used as a display unit (e.g., a display or a touch-display) of a television, a laptop computer, a monitor, an electronic billboard, or an Internet of Things (IoT) device. As another example, the display device 10 may be applied to wearable devices, such as a smart watch, a watch phone, a glasses-type display, and a head-mounted display (HMD) device.

The display device 10 may have a shape similar to a quadrangular shape when viewed from the top (e.g., in a plan view). For example, the display device 10 may have a shape similar to a rectangle having shorter sides extending in a first direction DR1 and longer sides extending in a second direction DR2. In FIG. 1, a third direction DR3 refers to a normal direction perpendicular to or substantially perpendicular to a plane defined by the first and second directions DR1 and DR2. The corners where the shorter sides and the longer sides meet may be rounded to have a suitable curvature (e.g., a predetermined curvature), or may be formed at a right angle. The shape of the display device 10 when viewed from the top (e.g., in a plan view) is not limited to the quadrangular shape, and may be formed in a shape similar to other polygonal shapes, a circular shape, or an elliptical shape.

The display device 10 may include a display panel 110, a circuit board 120, and a power supply unit (e.g., a power supply or a power supply device) 130.

The display panel 110 includes a semiconductor wafer substrate 200 (e.g., see FIG. 2) as a base substrate. The display panel 110 may include a main area MA and a subsidiary area SBA.

The main area MA may include a display area DA including a plurality of pixels PX (e.g., see FIG. 3) for displaying images, and a non-display area NDA located around (e.g., adjacent to) the display area DA. The non-display area NDA may refer to an area other than the display area DA. For example, the non-display area may at least partially surround (e.g., around a periphery of) the display area DA. The display area DA may output light from a plurality of emission areas or a plurality of open areas. For example, the display panel 110 may include a plurality of pixel driver circuits PC (e.g., see FIG. 4) including switching elements, a pixel-defining layer that defines the emission areas or the open areas, and a plurality of light-emitting elements LEL (e.g., see FIG. 5), which may be self-luminous elements.

The light-emitting element LEL may include, but is not limited to, at least one of an organic light-emitting diode including an organic emissive layer, a quantum-dot light-emitting diode (quantum LED) including a quantum-dot emissive layer, an inorganic light-emitting diode (inorganic LED) including an inorganic semiconductor, and/or a micro light-emitting diode (micro LED).

The non-display area NDA may be disposed on the outer side of the display area DA. The non-display area NDA may be defined as an edge area of the main area MA of the display panel 110. The non-display area NDA may include fan-out lines extended from lines (e.g., gate lines, data lines, and emission control lines) of the display area DA, and display pads connecting the fan-out lines with a display driver circuit 210 (e.g., see FIG. 2). The non-display area NDA may further include test lines for testing whether the pixel driver circuits PC (e.g., see FIG. 4) are defective or not, and test pads connected to the test lines during a test process (e.g., an electrical die sorting (EDS) process) for testing for defects of the semiconductor wafer substrate 200. The non-display area NDA may further include a test switching circuit for switching connections between the test lines and the fan-out lines during the test process. The elements disposed in the non-display area NDA for the test process will be described in more detail below with reference to FIGS. 7 to 10.

The subsidiary area SBA may be extended from one side of the main area MA. The subsidiary area SBA may include a main pad area connected to the circuit board 120. Optionally, the subsidiary area SBA may be omitted as needed or desired, and the main pad area may be located in the non-display area NDA.

The circuit board 120 may be attached on the main pad area of the display panel 110 using an anisotropic conductive film (ACF). Lead lines of the circuit board 120 may be electrically connected to the main pad area of the display panel 110. The circuit board 120 may be a flexible printed circuit board (FPCB), a printed circuit board (PCB), or a flexible film, such as a chip-on-film (COF).

The power supply unit 130 may be disposed on the circuit board 120 to apply supply voltages to the display driver circuit 210 and the display panel 110. The power supply unit 130 may generate supply voltages to provide the supply voltages to the supply voltage lines. For example, the supply voltages may include a high-level voltage (e.g., a first supply voltage ELVDD), a low-level voltage (e.g., a second supply voltage ELVSS), and a ground potential (e.g., a third power supply voltage GND), which may be used for driving the light-emitting elements LEL.

Figure 2:
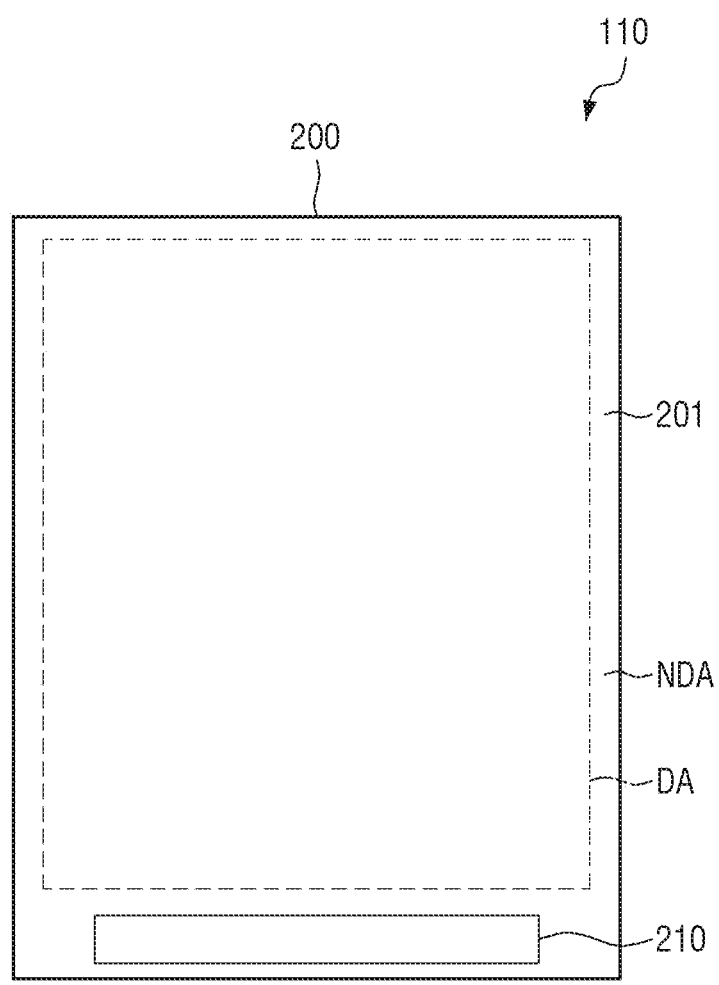
FIG. 2 is a plan view showing a display panel according to an embodiment of the present disclosure.

FIG. 2 is a plan view showing a display panel according to an embodiment of the present disclosure.

Referring to FIG. 2, the display panel 110 may be an OLEDOS (Organic Light Emitting Diode on Silicon) panel including the semiconductor wafer substrate 200 as the base substrate. For example, the display panel 110 may include the semiconductor wafer substrate 200, and pixel driver circuits PC (e.g., see FIG. 4) and a display driver circuit 210 for controlling the pixel driver circuits PC may be disposed on a front surface 201 of the semiconductor wafer substrate 200. The pixel driver circuits PC are disposed to overlap with the light-emitting elements LEL (e.g., see FIG. 5) of the pixels PX (e.g., see FIG. 3) in the display area DA. The display driver circuit 210 is disposed in the non-display area NDA, and drives the pixel driving circuits PC.

The pixel driver circuits PC (e.g., see FIG. 4) and the display driver circuit 210 may be formed on a MOSFET layer 501 (e.g., see FIG. 5) disposed on the front surface 201 of the semiconductor wafer substrate 200. The MOSFET layer 501 may include, for example, an n-type metal oxide semiconductor field effect transistor (MOSFET) and/or a p-type MOSFET.

Figure 3:
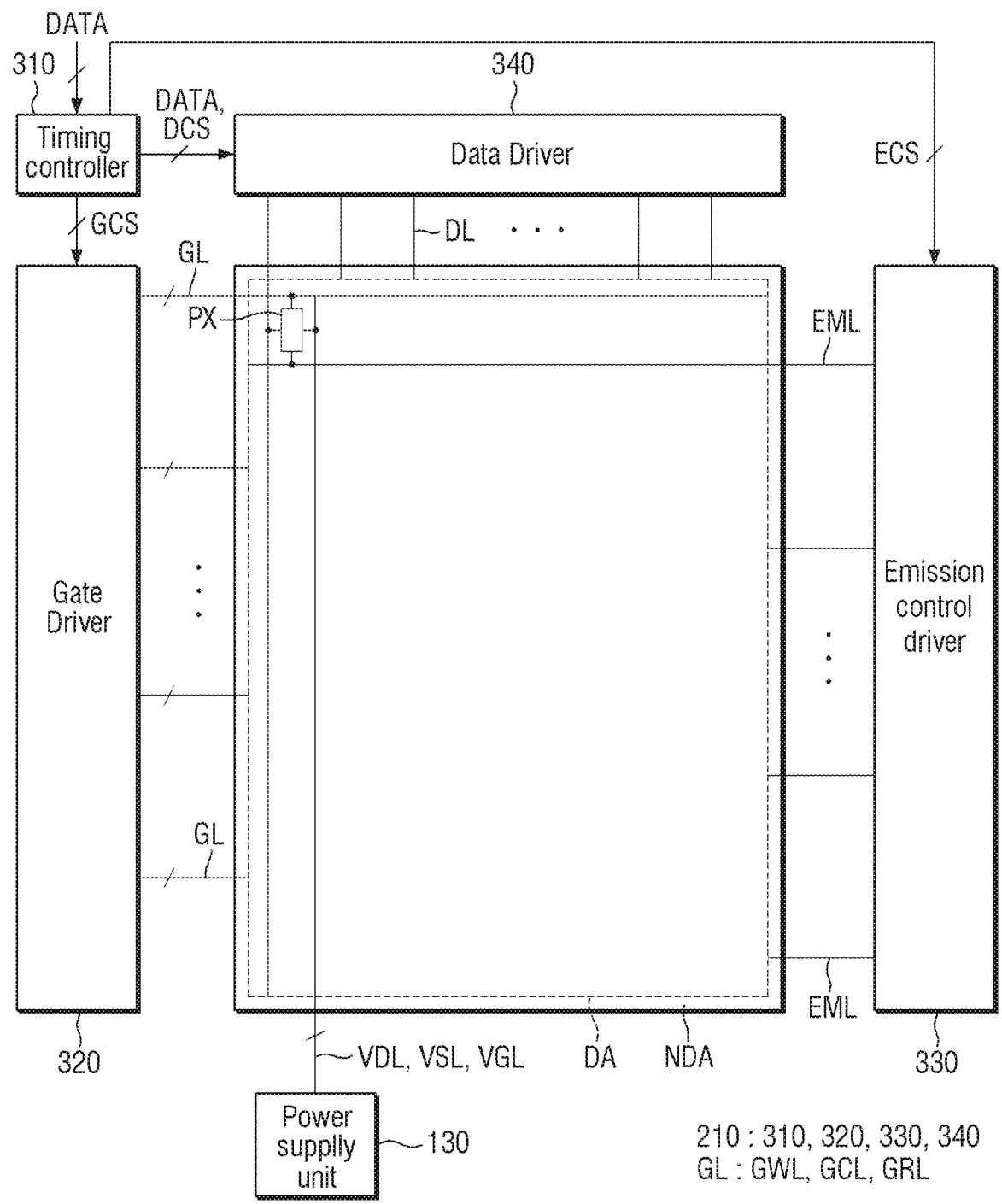
FIG. 3 is a block diagram showing a display device according to an embodiment of the present disclosure.

FIG. 3 is a block diagram showing a display device according to an embodiment of the present disclosure.

Referring to FIG. 3, the display device 10 includes the display panel 110 based on the semiconductor wafer substrate 200. The display panel 10 has the display driver circuit 210 incorporated therein. The display driver circuit 210 is formed on the MOSFET layer 501 disposed on the front surface 201 of the semiconductor wafer substrate 200. The display driver circuit 210 may include, but is not limited to, a timing controller 310, a gate driver 320, an emission control driver 330, and a data driver 340. The display driver circuit 210 may further include a memory (e.g., a one-time-programmable (OTP) memory), an interface circuit (e.g., I/F), an image processing circuit (e.g., logic), and/or a gamma correction circuit.

The display area DA of the display panel 110 includes the plurality of pixels PX arranged in a matrix. Each of the plurality of pixels PX may be connected to a first supply voltage line VDL, a second supply voltage line VSL, a third supply voltage line VGL, a gate line GL, an emission control line EML, and a data line DL.

The first supply voltage line VDL supplies the first supply voltage ELVDD input from the power supply unit 130 to the plurality of pixels PX. The second supply voltage line VSL supplies the second supply voltage ELVSS input from the power supply unit 130 to the plurality of pixels PX. The third supply voltage GND input from the power supply unit 130 is applied to the plurality of pixels PX through the third supply voltage lines VGL. The gate line GL supplies gate signals GR, GI, and GW (e.g., see FIG. 4) input from the gate driver 320 to the plurality of pixels PX. The emission control line EML supplies an emission signal EM input from the emission control driver 330 to the plurality of pixels PX. The data line DL supplies analog data voltages input from the data driver 340 to the pixels PX.

The first supply voltage ELVDD may be a high-level voltage, and the second supply voltage ELVSS may be a low-level voltage. For example, the first supply voltage ELVDD may have a higher voltage level than that of the second supply voltage ELVSS. The third supply voltage GND may be the ground potential.

One gate line GL shown in FIG. 3 may include, but is not limited to, a first gate line GWL, a second gate line GCL, and a third gate line GRL.

Each of the plurality of pixels PX may include a light-emitting element LEL (e.g., see FIG. 4), and a plurality of transistors and at least one capacitor as a pixel driver circuit PC (e.g., see FIG. 4) for driving the light-emitting element LEL.

The timing controller 310 may receive data signals DATA and timing signals from the circuit board 120. The timing controller 310 may control the operation timing of the data driver 340 by generating a data control signal DCS based on the timing signals. The timing controller 310 may control the operation timing of the gate driver 320 by generating a gate control signal GCS based on the timing signals. The timing controller 310 may control the operation timing of the emission control driver 330 by generating an emission control signal ECS based on the timing signals.

The data driver 340 may convert the data signal DATA into the analog data voltages, and may provide the converted analog data voltages to the pixels PX through the data lines DL. The gate signals from the gate driver 320 may be used to select pixels PX to which a data voltage is applied, and the selected pixels PX may receive the data voltage through the data lines DL.

The power supply unit 130 may be disposed on the circuit board 120 to apply the supply voltages to the display driver circuit 210 and the display panel 110. The power supply unit 130 may generate a supply voltage to provide it to a supply voltage line VDL, and may generate a common voltage to provide it to a common electrode (e.g., a cathode electrode CAE of FIG. 5) that is common to the light-emitting elements LEL of the plurality of pixels PX.

The gate driver 310 may provide the gate signals GR, GI and GW (e.g., see FIG. 4) to the pixels PX through the gate lines GL.

The emission control driver 330 may provide the emission signal EM (e.g., see FIG. 4) to the pixels PX through the emission control lines EML.

Figure 4:
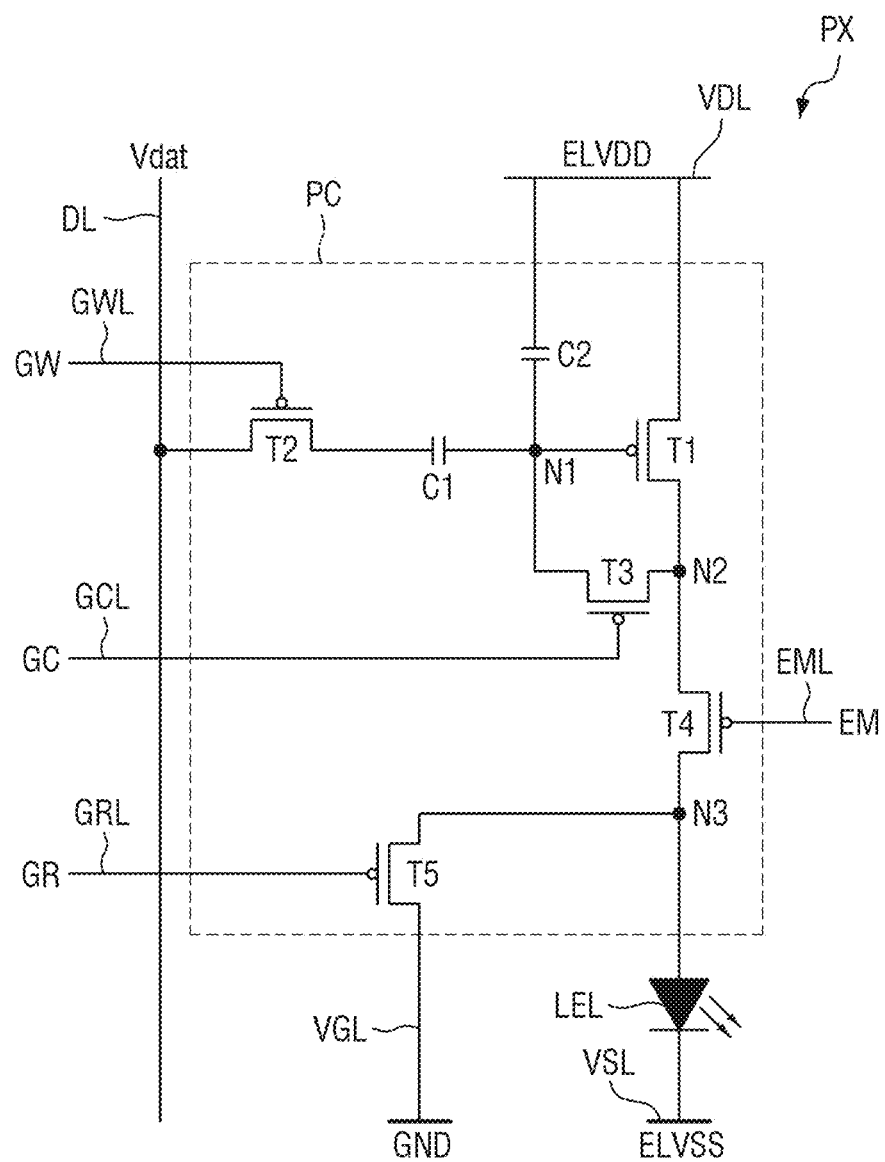
FIG. 4 is a circuit diagram of a pixel of a display device according to an embodiment of the present disclosure.

FIG. 4 is a circuit diagram of a pixel of a display device according to an embodiment of the present disclosure.

Referring to FIG. 4, a pixel PX may include a light-emitting element LEL (e.g., an organic light-emitting diode) as a display element, and a pixel driver circuit PC connected to the light-emitting element LEL. The pixel driver circuit PC may include first to fifth transistors T1, T2, T3, T4, and T5, and first and second capacitors C1 and C2.

The first to fifth transistors T1, T2, T3, T4, and T5 may be implemented as n-type MOSFETs and/or p-type MOSFETs. Although the first to fifth transistors T1, T2, T3, T4, and T5 are all illustrated as p-type MOSFETs in the embodiment shown in FIG. 4, the present disclosure is not limited thereto.

The first transistor T1 may be a driving transistor in which a source-drain current is determined depending on a gate-source voltage thereof. Each of the second to fifth transistors T2 to T5 may be a switching transistor that is turned on/off depending on a gate-source voltage thereof, substantially a gate voltage thereof.

Depending on the kinds of the transistors (p-type or n-type) and/or the operating conditions of the transistors, the first electrode of each of the first to fifth transistors T1, T2, T3, T4, and T5 may be a source electrode or a drain electrode, and the second electrode may be the other of the source electrode or the drain electrode. For example, if the first electrode is a source electrode SE, the second electrode may be a drain electrode DE. Hereinafter, a source electrode of a transistor may refer to an electrode connected to a source region of the transistor (e.g., a corresponding MOSFET). Hereinafter, a drain electrode of a transistor may refer to an electrode connected to a drain region of the transistor (e.g., the corresponding MOSFET).

The first transistor T1 includes a gate electrode connected to a first node N1, a source electrode connected to the first supply voltage line VDL, and a drain electrode connected to a second node N2. The first transistor T1 is turned on or off based on the voltage level of the first node N1. The first transistor T1 receives a data signal Vdat (e.g., the analog data voltage) according to the switching operation of the second transistor T2, and controls the magnitude of a driving current (e.g., the amount of the driving current) flowing to the light-emitting element LEL based on the received data signal Vdat.

The second transistor T2 includes a gate electrode connected to the first gate line GWL, a source electrode connected to the data line DL, and a drain electrode connected to the first node N1 via the first capacitor C1 therebetween. In other words, the first capacitor C1 is disposed between the drain electrode of the second transistor T2 and the first node N1. The second transistor T2 is turned on in response to the first gate signal GW input through the first gate line GWL. The turned-on second transistor T2 receives the data signal Vdat through the data line DL, and transfers the received data signal Vdat to the first node N1 through the first capacitor C1.

The third transistor T3 includes a gate electrode connected to the second gate line GCL, a source electrode connected to the second node N2, and a drain electrode connected to the first node N1. The third transistor T3 is turned on in response to the second gate signal GC input through the second gate line GCL. The turned-on third transistor T3 may compensate for the threshold voltage of the first transistor T1. The second node N2 may be a node connected to the drain electrode of the first transistor T1.

The fourth transistor T4 includes a gate electrode connected to an emission control line EML, a source electrode connected to the second node N2, and a drain electrode connected to a third node N3 connected to the light-emitting element LEL. The fourth transistor T4 is turned on in response to the emission signal EM input through the emission control line EML. The turned-on fourth transistor T4 transfers the driving current transmitted from the first transistor T1 to the light-emitting element LEL. The third node N3 may be connected to an anode electrode of the light-emitting element LEL.

The fifth transistor T5 includes a gate electrode connected to the third gate line GRL, a source electrode connected to the third node N3, and a drain electrode connected to the third supply voltage line VGL. The fifth transistor T5 is turned on in response to the third gate signal GR input through the third gate line GRL. The turned-on fifth transistor T5 may connect the third node N3 with the third supply voltage line VGL connected to the ground potential GND.

The third supply voltage line VGL may be connected to the ground potential GND while the display panel 110 displays images, but a voltage different from the ground potential GND may be provided during a period of inspecting for defects on the pixel driver circuits PC. For example, as will be described in more detail below with reference to FIGS. 9 and 10, a reference voltage Vref different from the ground potential GND may be applied to the third supply voltage line VGL during the period of testing for defects of the pixel driver circuits PC. Accordingly, the drain electrode of the fifth transistor T5 of each pixel PX connected to the third supply voltage line VGL may be connected to the ground potential GND while the display panel 110 displays images, but a voltage different from that of the ground potential GND may be supplied during a period of inspecting for defects on the pixel driver circuit PC. By applying the reference voltage different from the ground potential GND to the third supply voltage line VGL during the period of inspecting for defects on the pixel driver circuits PC, it may be possible to easily measure electrical signals (e.g., a current or a voltage) related to the characteristics on the transistors T1, T2, T3, T4, and T5 included in the pixel driver circuits PC. If the fifth transistor T5 is connected to the ground potential GND during the test period, at least a part of the electrical signals of each pixel PX may not be transferred to a test apparatus 710 (e.g., see FIG. 7) through a test line TL1 (e.g., see FIG. 7), but may be discharged to the ground potential GND. According to the present embodiment, the reference voltage Vref different from the ground potential GND is applied to the third supply voltage VGL during the test period in order to prevent or substantially prevent a part of the electrical signal from being discharged to the ground potential GND. According to the present embodiment, during the period of inspecting for defects on the pixel driver circuits PC, electrical signals (e.g., a current or a voltage) related to the characteristics of the transistors T1, T2, T3, T4, and T5 included in the pixel driver circuits PC may be measured more accurately.

The electrical signals related to the characteristics of the transistors T1, T2, T3, T4, and T5 included in the pixel driver circuit PC may include voltages or currents of the nodes (e.g., the first node N1, the second node N2, and the third node N3) included in the pixel driver circuits PC. During the test period, the test apparatus 710 detects an electrical signal related to the pixel driver circuit PC of each of the plurality of pixels PX included in the display area DA, thereby determining whether the transistors T1, T2, T3, T4, and T5 included in the pixel driver circuit PC are defective or not.

The first capacitor C1 is disposed between the second transistor T2 and the first node N1. The first capacitor C1 may store the data signal Vdat input through the second transistor T2.

The second capacitor C2 is disposed between the first supply voltage line VDL and the first node N1. The second capacitor C2 may store the threshold voltage of the first transistor T1.

The light-emitting element LEL may include a pixel electrode (e.g., the anode electrode ANE of FIG. 8) and the common electrode (e.g., the cathode electrode CAE of FIG. 5) facing or opposite to the pixel electrode. The common electrode may receive the second supply voltage ELVSS. The common electrode may be connected to the second supply voltage line VSL for transmitting the second supply voltage ELVSS. The common electrode may be commonly connected to a plurality of pixels PX.

Figure 5:
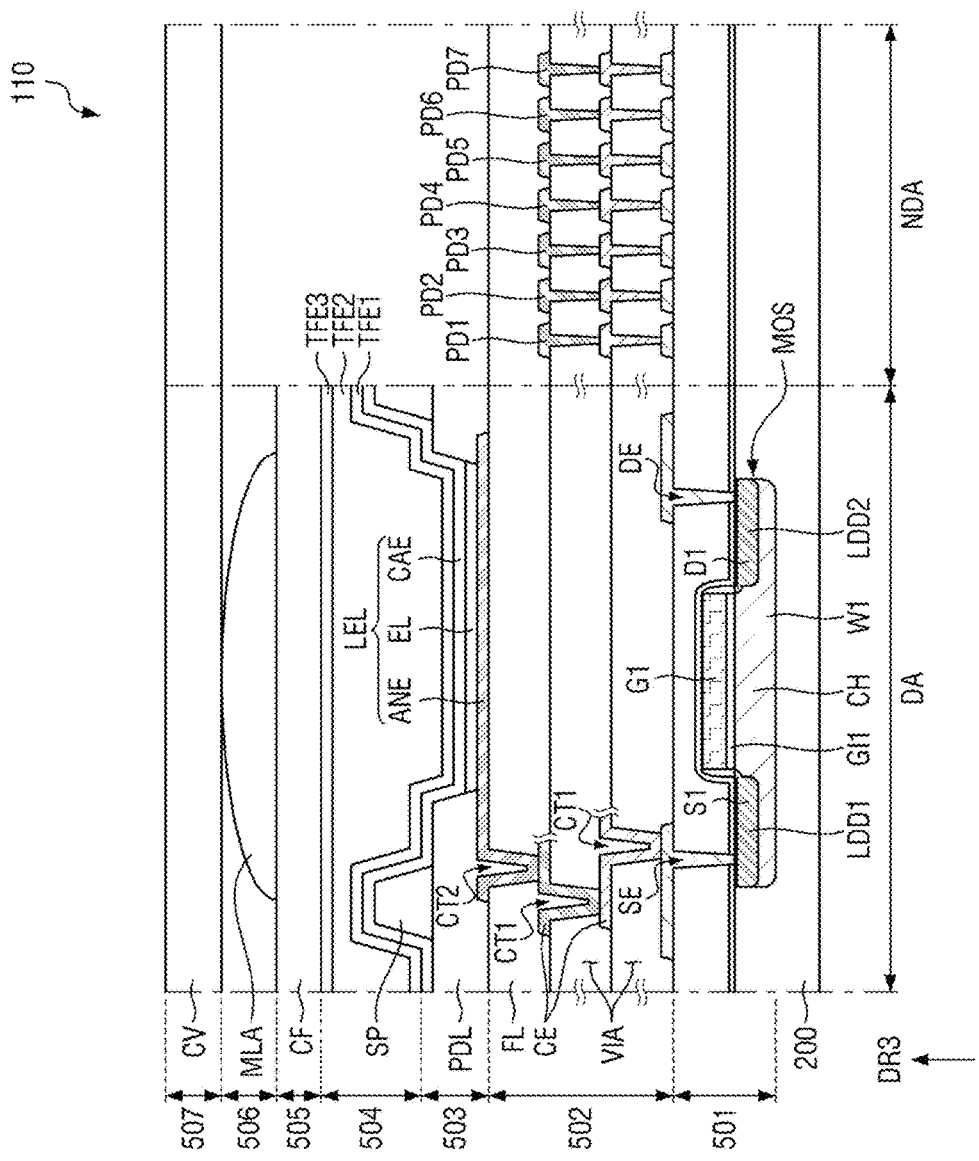
FIG. 5 is a cross-sectional view showing a portion of a display panel of a display device according to an embodiment of the present disclosure.

FIG. 5 is a cross-sectional view showing a portion of a display panel of a display device according to an embodiment of the present disclosure. For example, FIG. 5 is a view schematically showing a stacked structure of each of a non-display area and a display area of the display panel according to an embodiment.

In following description with reference to FIG. 5, the term "on" may refer to a side in the third direction DR3 where the front surface of the semiconductor wafer substrate 200 faces. The front surface of the semiconductor wafer substrate 200 may refer to a direction in which light-emitting element LEL disposed in the display area DA emits light for displaying images.

Referring to FIG. 5, the display panel 110 includes the semiconductor wafer substrate 200 as the base substrate. The MOSFET layer 501 including the display driver circuit 210 and the pixel driver circuit PC, at least one line layer 502, a light-emitting element layer 503 including the light-emitting element LEL, an encapsulation layer 504 covering the light-emitting element LEL, a color filter layer 505 including a color filter CF, a light control layer 506 including a refractive film MLA, and a protective layer 507 including a cover glass CV may be sequentially stacked on the front surface of the semiconductor wafer substrate 200. At least some of the light-emitting element layer 503, the encapsulation layer 504, the color filter layer 505, the light control layer 506, and/or the protective layer 507 may not be disposed in the non-display area NDA.

The semiconductor wafer substrate 200 may be a silicon substrate, a germanium substrate, or a silicon-germanium substrate. The semiconductor wafer substrate 200 may be a substrate doped with first-type impurities.

The MOSFET layer 501 including an n-type MOSFET and/or a p-type MOSFET is disposed on the semiconductor wafer substrate 200. The first-type impurities may be p-type impurities, and second-type impurities may be n-type impurities. As another example, the first-type impurities may be n-type impurities, and the second-type impurities may be p-type impurities.

Hereinafter, an n-type MOSFET MOS included in the MOSFET layer 501 will be described in more detail as a representative example. The n-type MOSFET MOS may include a well W1 doped with n-type impurities in a substrate doped with p-type impurities. The well W1 may include a first low-concentration impurity region LDD1 and a second low-concentration impurity region LDD2 having a relatively lower impurity concentration than that of other portions. The first low-concentration impurity region LDD1 may define a source region S1, and the second low-concentration impurity region LDD2 may define a drain region D1. A channel CH overlapping with a gate G1 is defined between the first low-concentration impurity region LDD1 and the second low-concentration impurity region LDD2. An oxide film GI1 may be disposed between the gate G1 and the well W1 as an insulating layer.

The MOSFETs MOS form the display driver circuit 210, and the display driver circuit 210 is disposed in the non-display area NDA of the display panel 110. In addition, the MOSFETs MOS form the pixel driver circuits PC, and the pixel driver circuits PC are disposed in the display area DA of the display panel 110. In other words, each of the pixel driver circuits PC includes a combination of MOSFETS MOS disposed in the MOSFET layer 501 in the display area DA. In addition, the display driver circuit 210 includes a combination of MOSFETs MOS disposed in the MOSFET layer 501 in the non-display area NDA. In the embodiment shown in FIG. 5, one MOSFET MOS of a pixel driver circuit PC disposed in the display area DA of the display panel 110 is shown for convenience of illustration.

The at least one line layer 502 is disposed on the MOSFET layer 501. The at least one line layer 502 includes insulating layers VIA sequentially stacked on the MOSFET layer 501, and electrodes CE and lines connected to the MOSFETs MOS through contact holes CT1 penetrating at least some of the insulating layers VIA.

The electrodes CE disposed in the line layer 502 include first vertical connection electrodes CE that connect some MOSFETs MOS associated with the pixel driver circuit PC from among a plurality of MOSFETs MOS disposed in the MOSFET layer 501 with the light-emitting element LEL disposed on the line layer 502 in the vertical direction (e.g., the third direction DR3). Hereinafter, the vertical direction refers to a normal direction of the display panel 110.

Lines disposed in the line layer 502 include lines (e.g., the lines GL, DL, and EML in FIG. 3) connected to the pixel driver circuit PC. The lines disposed in the line layer 502 may further include fan-out lines (e.g., the lines FDL1 and FDLm of FIG. 7) that are disposed in the non-display area NDA, and extended from the lines (e.g., the lines GL, DL, and EML of FIG. 3) connected to the pixel driver circuits PC. The lines disposed in the line layer 502 may further include the test lines TL1 and TL2 (e.g., see FIG. 9) that are disposed in the non-display area NDA, and may read out electrical signals (e.g., a current or a voltage) for inspecting for defects on the pixel driver circuit PC to an external test apparatus.

The line layer 502 may include pad electrodes PD1, PD2, PD3, PD4, PD5, PD6, and PD7 disposed in the non-display area NDA. The pad electrodes PD1, PD2, PD3, PD4, PD5, PD6, and PD7 may include a data pad PD1 connected to the data driver 340 of the display driver circuit 210, a gate pad PD2 connected to the gate driver 320 of the display driver circuit 210 (or an emission control pad connected to an emission control circuit), a first supply voltage pad PD3 from which the first supply voltage ELVDD is applied, a second supply voltage pad PD4 from which the second supply voltage ELVSS is applied, a third supply voltage pad PD5 from which the third supply voltage (e.g., the ground potential GND) is applied, and a first test pad PD6 and a second test pad PD7 in contact with the test apparatus 710 (e.g., see FIG. 7). The test pads PD6 and PD7 in contact with the test apparatus 710 are not necessarily limited to the first test pad PD6 and the second test pad PD7, and the number thereof may be variously modified as needed or desired. The pad electrodes PD1, PD2, PD3, PD4, PD5, PD6, and PD7 may be disposed in the uppermost layer of the line layer 502 in order to conduct a test process (e.g., 640 of FIG. 6). After conducting the test process (e.g., 640 of FIG. 6) using the pad electrodes PD1, PD2, PD3, PD4, PD5, PD6, and PD7, a flattening film FL may be deposited over the pad electrodes PD1, PD2, PD3, PD4, PD5, PD6, and PD7, and the light-emitting elements LEL may be formed on the flattening film FL.

The line layer 502 may further include a second vertical connection electrode connecting between some of the MOSFETs MOS through contact holes penetrating some of the insulating layers VIA, and/or a third vertical connection electrode connecting some of the MOSFETs MOS with the lines (e.g., the lines GL, DL, and EML of FIG. 3) connected to the pixel driver circuits PC through the contact holes.

The light-emitting element layer 503 including the light-emitting elements LEL may be disposed on at least one of the line layers 502 including the flattening film FL. The light-emitting element LEL includes an anode electrode ANE connected to a MOSFET MOS included in the pixel driver circuit PC through the first vertical connection electrode CE, an emissive layer EL disposed on the anode electrode ANE, and a cathode electrode CAE disposed on the emissive layer EL. The light-emitting element layer 503 may further include a pixel-defining film PDL that defines each of the plurality of pixels PX, and a separator SP disposed on the pixel-defining film PDL. The separator SP may be referred to as a partition wall or a spacer.

The encapsulation layer 504 including at least one organic encapsulation layer and at least one inorganic encapsulation layer may be disposed on the light-emitting element layer 503. For example, the encapsulation layer 504 may include, but is not limited to, a first inorganic encapsulation film TFE1, an organic encapsulation film TFE2, and a second inorganic encapsulation film TFE3.

The color filter layer 505 including the color filters CF may be disposed on the encapsulation layer 504. The color filters CF may include, but is not limited to, a red color filter that transmits red light, a green color filter that transmits green light, and a blue color filter that transmits blue light. The color filter layer 505 is disposed in the display device where the light-emitting elements LEL of the light-emitting element layer 503 emit white light. If the light-emitting elements LEL of the light-emitting element layer 503 emit red light, green light, and blue light on their own, the color filter layer 505 may be omitted.

The light control layer 506 including the refractive film MLA is disposed on the color filter layer 505. The refractive film MLA may refract light incident thereon, so that light emitted from the light-emitting element layer 503 is directed toward the normal direction (e.g., the third direction DR3) of the display panel 110. The refractive film MLA may be referred to as a light control pattern.

The protective layer 507 serving as a cover layer may be disposed on the light control layer 506. The protective layer 507 may include, but is not limited to, the cover glass CV made of glass. The protective layer 507 may include, for example, a protective film.

Figure 6:
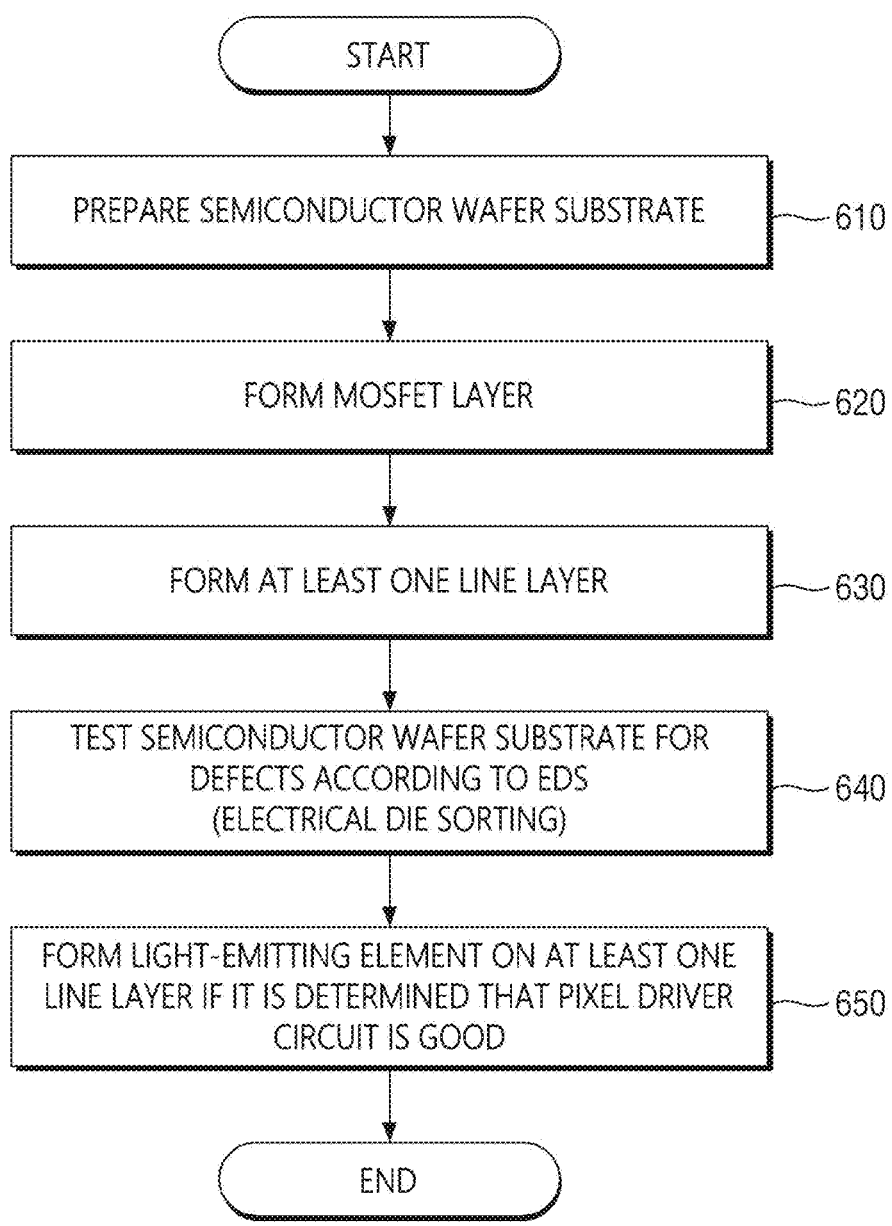
FIG. 6 is a flowchart illustrating at least some processes of a method of fabricating a display device according to an embodiment of the present disclosure.

FIG. 6 is a flowchart illustrating at least some processes of a method of fabricating a display device according to an embodiment of the present disclosure.

At least some of the processes described with reference to the other drawings may be added before or after the processes described below with reference to FIG. 6. In addition, the processes for fabricating semiconductor and/or display panels known to those having ordinary skill in the art may be added before or after the processes described below with reference to FIG. 6.

Hereinafter, at least some of the processes for the method of fabricating a display device according to an embodiment will be described in more detail with reference to FIG. 6.

Referring to FIG. 6, a semiconductor wafer substrate may be prepared at block 610. The semiconductor wafer substrate may be a silicon substrate, a germanium substrate, or a silicon-germanium substrate. The semiconductor wafer substrate may be a substrate doped with first-type impurities (e.g., p-type impurities).

A MOSFET layer 501 including an n-type MOSFET and/or a p-type MOSFET is formed on the front surface of the semiconductor wafer substrate 200 at block 620. The MOSFETs MOS form the display driver circuit 210, and the display driver circuit 210 is disposed in the non-display area NDA of the display panel 110. In addition, the MOSFETs MOS form the pixel driver circuits PC, and the pixel driver circuits PC are disposed in the display area DA of the display panel 110.

At least one line layer is formed on the MOSFET layer 501 at block 630.

The at least one line layer 502 includes insulating layers VIA sequentially stacked on the MOSFET layer 501, and electrodes CE and lines connected to the MOSFETs MOS through contact holes CT1 penetrating at least some of the insulating layers VIA.

The electrodes CE disposed in the line layer 502 include first vertical connection electrodes CE that connect some MOSFETs MOS associated with the pixel driver circuits PC from among a plurality of MOSFETs MOS disposed in the MOSFET layer 501 with the light-emitting elements LEL disposed on the line layer 502 in the vertical direction (e.g., the third direction DR3). The vertical direction refers to the normal direction of the display panel 110.

Lines disposed in the line layer 502 include lines (e.g., the lines GL, DL, and EML in FIG. 3) connected to the pixel driver circuit PC. The lines disposed in the line layer 502 may further include fan-out lines (e.g., the lines FDL1 and FDLm of FIG. 7) that are disposed in the non-display area NDA, and extended from the lines (e.g., the lines GL, DL, and EML of FIG. 3) connected to the pixel driver circuits PC. The lines disposed in the line layer 502 may further include the test lines TL1 and TL2 (e.g., see FIG. 9) that are disposed in the non-display area NDA, and read out electrical signals (e.g., a current or a voltage) for inspecting for defects on the pixel driver circuit PC to an external test apparatus.

The line layer 502 may include pad electrodes PD1, PD2, PD3, PD4, PD5, PD6, and PD7 disposed in the non-display area NDA. The pad electrodes PD1, PD2, PD3, PD4, PD5, PD6, and PD7 may include a data pad PD1 connected to the data driver 340 of the display driver circuit 210, a gate pad PD3 connected to the gate driver 320 of the display driver circuit 210 (or an emission control pad connected to an emission control circuit), a first supply voltage pad PD3 from which the first supply voltage ELVDD is applied, a second supply voltage pad PD4 from which the second supply voltage ELVSS is applied, a third supply voltage pad PD5 from which the third supply voltage (e.g., the ground potential GND) is applied, and a first test pad PD6 and a second test pad PD7 to come into contact with the test apparatus 710 (e.g., see FIG. 7). The test pads PD6 and PD7 in contact with the test apparatus 710 are not necessarily limited to the first test pad PD6 and the second test pad PD7, and the number thereof may be variously modified as needed or desired. The pad electrodes PD1, PD2, PD3, PD4, PD5, PD6, and PD7 may be disposed at the uppermost layer of the line layers 502 in order to conduct a test process. After conducting the test process using the pad electrodes PD1, PD2, PD3, PD4, PD5, PD6, and PD7, a flattening film FL may be deposited over the pad electrodes PD1, PD2, PD3, PD4, PD5, PD6, and PD7, and light-emitting elements LEL may be formed on the flattening film FL.

An electrical die sorting (EDS) process (hereinafter referred to as a "test process") may be conducted to inspect for defects on the semiconductor wafer substrate at block 640. In the test process, defects may be inspected on a plurality of MOSFETs MOS disposed on the MOSFET layer 501. For example, in the test process, defects may be inspected on the MOSFETs MOS included in the display driver circuit 210 and on the MOSFETs MOS included in the pixel driver circuit PC. As such, the test process may be performed while the pad electrodes PD1, PD2, PD3, PD4, PD5, PD6, and PD7 are exposed on the uppermost layer of the line layers 502.

If it is determined that the semiconductor wafer substrate 200 is good (e.g., not defective) via the test process (e.g., if it is determined that the pixel driver circuits PC are good), the light-emitting element layer 503 may be formed on the line layer 502 at block 650. After forming the light-emitting element layer 503, the encapsulation layer 504 covering the light-emitting elements LEL, the color filter layer 505 including the color filters CF, a light control layer 506 including a refraction film MLA, and a protective layer 507 including a cover glass CV may be sequentially formed on the light-emitting element layer 503.

Hereinafter, a test process (e.g., 640 of FIG. 6) will be described in more detail with reference to FIGS. 7 to 10.

Figure 7:
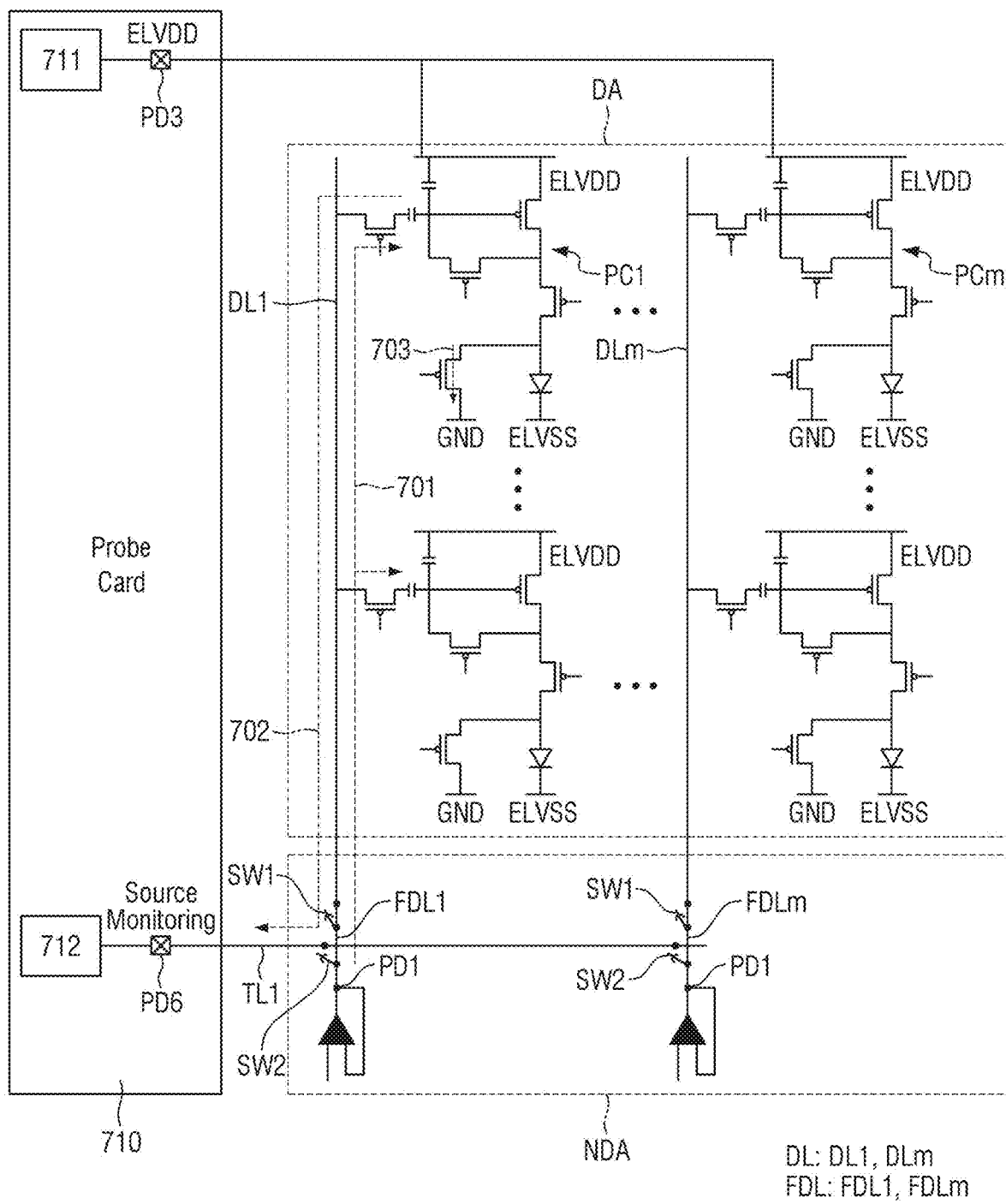
FIG. 7 is a view schematically illustrating a portion of the display panel for inspecting for defects on pixel driver circuits according to an embodiment of the present disclosure.
Figure 8:
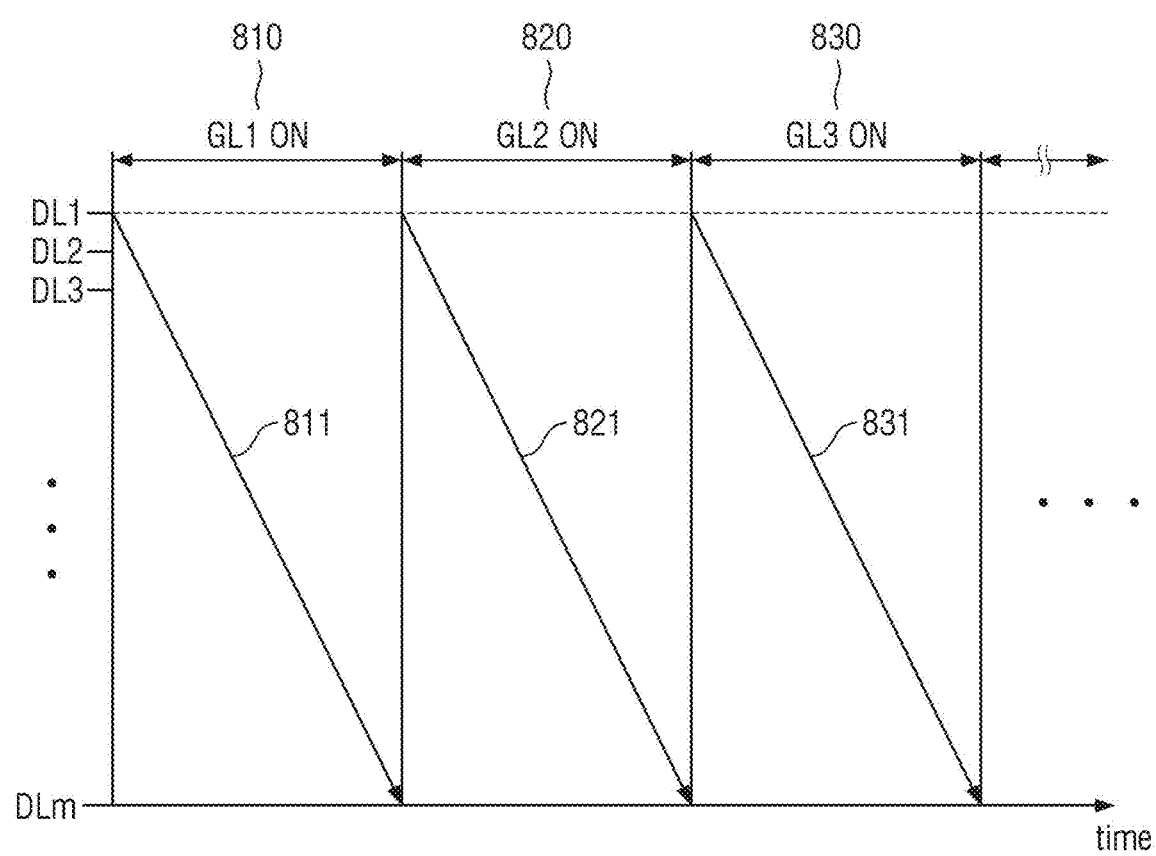
FIG. 8 is a timing diagram for inspecting for defects on pixel driver circuits according to an embodiment of the present disclosure.

FIG. 7 is a view schematically illustrating a portion of the display panel 110 for inspecting for defects on pixel driver circuits PC according to an embodiment of the present disclosure. FIG. 8 is a timing diagram for inspecting for defects on pixel driver circuits PC according to an embodiment of the present disclosure.

FIG. 7 shows pixel driving circuits PC included in some pixels PX from among the plurality of pixels PX disposed in the display area DA of the display panel 110. For example, a first pixel driver circuit PC1 drives the pixel arranged in a first row and a first column from among the plurality of pixels PX. An $m^{th}$ pixel driver circuit PCm drives the pixel arranged in the first row and an $m^{th}$ column from among the plurality of pixels PX, where m is a natural number greater than 1.

The first to $m^{th}$ pixel driving circuits PC1 to PCm for driving a plurality of pixels PX in the respective rows and/or columns are disposed in the display area DA. The first to $m^{th}$ pixel driver circuits PC1 to PCm are connected to data pads PD1 of the data driver 340 through data lines DL and data fan-out lines FDL. For example, the first pixel driver circuit PC1 is connected to the data pad PD1 of the data driver 340 through the first data line DL1 and the first data fan-out line FDL1.

As indicated by a dashed arrow 701 in FIG. 7, the first pixel driver circuit PC1 outputs a data signal Vdat output from the data pad PD1 of the data driver 340 through the first data line DL1 while the display panel 110 displays images. As indicated by a dashed arrow 702 in FIG. 7, during the test period for conducting the test process, an electrical signal (a current or a voltage) generated from the first pixel driver circuit PC1 is read out to the test apparatus 710 through the first data line DL1, the first data fan-out line FDL1, and the first test line TL1.

Similarly, the $m^{th}$ pixel driver circuit PCm receives a data signal Vdat output from the data pad PD1 of the data driver 340 through the $m^{th}$ data line DLm while the display panel 110 displays images. During the test period for conducting the test process, an electrical signal (a current or a voltage) generated from the $m^{th}$ pixel driver circuit PCm is read out to the test apparatus 710 through the mth data line DLm, the mth data fan-out line FDLm, and the first test line TL1.

FIG. 7 shows some pads PD1, PD3, and PD6 that are used in a test process (e.g., 640 of FIG. 6) from among the plurality of pads PD1, PD2, PD3, PD4, PD5, PD6, and PD7 disposed in the non-display area NDA of the display panel 110. In addition, FIG. 7 shows the data fan-out lines FDL1 to FDLm and the first test line TL1, which are some of a plurality of lines disposed in the non-display area NDA.

FIG. 7 shows the test apparatus 710 used when a test process is conducted. The test apparatus 710 may be, but is not limited to, a probe card. The test apparatus 710 may include a power supply unit (e.g., a power supply or a power supply device) 711 and a measurement unit (e.g., a measurement circuit or device) 712, and may further include a controller for controlling them. The power supply unit 711 of the test apparatus 710 applies the first supply voltage ELVDD to the first supply voltage pad PD3. Accordingly, the first to m[th] pixel driving circuits PC1 to PCm receive the first supply voltage ELVDD. The measurement unit 712 of the test apparatus 710 measures electrical signals generated from each of the pixel driving circuits PC1 to PCm through the first test pad PD6 connected to the first test line TL1. The controller of the test apparatus 710 determines whether or not each of the pixel driving circuits PC1 to PCm is defective based on the electrical signals input through the measurement unit 712.

Incidentally, as indicated by a dashed arrow 703 of FIG. 7, a part of the electrical signal generated from each of the pixel driver circuits (e.g., the first pixel driver circuit PC1) may be discharged to the ground potential GND as some of the transistors (e.g., the fifth transistor T5 of FIG. 4) included in the pixel driver circuit PC1 is connected to the ground potential GND. As described in more detail below with reference to FIGS. 9 and 10, in order to prevent or substantially prevent measurement errors, which may occur if a part of the electrical signal is discharged to the ground potential GND, a reference voltage Vref different from the ground potential GND may be applied to the third supply voltage line VGL during the test period.

Referring to FIG. 8, when a test process is performed, gate lines GL1, GL2, and GL3 may be sequentially driven to sequentially output the gate signals GW, GC, and GR at a gate-on voltage.

The test period for conducting the test process may be divided into several periods, for example, from a first test period 810 in which a gate line GL1 connected to the pixel driver circuits PC in the first row outputs the gate signals GW, GC, and GR at the gate-on voltage, to an nth test period (n being a natural number greater than 1) in which an nth gate line connected to the pixel driver circuits PC in an nth row (e.g., the last row) outputs the gate signals GW, GC, and GR at the gate-on voltage. In more detail, the test period for conducting the test process includes the first test period 810 to the nth test period.

Each of the gate lines GL1, GL2, and GL3 may be associated with a corresponding row of the pixels PX, and may include a corresponding first gate line GWL, a corresponding second gate line GCL, and a corresponding third gate line GRL, which may output the gate signals GW, GC, and GR at the gate-on voltage. Accordingly, the transistors T1, T2, T3, T4, and T5 (e.g., see FIG. 4) included in the pixel driver circuits PC associated with one row may be turned on concurrently or substantially simultaneously with each other during the test period. When the transistors T1, T2, T3, T4, and T5 (e.g., see FIG. 4) are turned on concurrently or substantially simultaneously with each other, the first supply voltage ELVDD is applied to the pixel driving circuits PC, so that a current path from inside the pixel driving circuits PC to the data lines DL may be formed. The current path may be read out to the test apparatus 710 as an electrical signal (e.g., a current or a voltage) related to the characteristics of the transistors T1, T2, T3, T4, and T5 included in the pixel driver circuits PC.

FIG. 8 shows, from among the first test period to the nth test period, the first test period 810 in which the gate signals GW, GC, and GR at the gate-on voltage are applied to the gate line GL1 connected to the pixel driving circuits PC in the first row, a second test period 820 in which the gate signals GW, GC, and GR at the gate-on voltage are applied to the gate line GL2 connected to the pixel driving circuits PC in the second row, and a third test period 830 in which the gate signals GW, GC, and GR at the gate-on voltage are applied to the gate line GL3 connected to the pixel driving circuits PC in the third row.

As indicated by an arrow 811 of FIG. 8, during the first test period 810, the test apparatus 710 sequentially receives electrical signals from the pixel driver circuits PC associated with the first row using a first multiplexer. The test apparatus 710 determines whether the transistors T1, T2, T3, T4, and T5 (e.g., see FIG. 4) included in the pixel driving circuits PC are defective or not by analyzing the received electrical signals.

As indicated by an arrow 821 of FIG. 8, during the second test period 820, the test apparatus 710 sequentially receives electrical signals from the pixel driver circuits PC associated with the second row using the first multiplexer. The test apparatus 710 determines whether the transistors T1, T2, T3, T4, and T5 (e.g., see FIG. 4) included in the pixel driving circuits PC are defective or not by analyzing the received electrical signals.

As indicated by an arrow 831 of FIG. 8, during the third test period 830, the test apparatus 710 sequentially receives electrical signals from the pixel driver circuits PC associated with the third row using the first multiplexer. The test apparatus 710 determines whether the transistors T1, T2, T3, T4, and T5 (e.g., see FIG. 4) included in the pixel driving circuits PC are defective or not by analyzing the received electrical signals.

Similarly, during each of the test periods from a fourth test period to the nth test period, the test apparatus 710 sequentially receives electrical signals from the pixel driver circuits PC associated with the corresponding row using the first multiplexer, and determines whether the transistors T1, T2, T3, T4, and T5 (e.g., see FIG. 4) included in the pixel driver circuits PC are defective or not by analyzing the received electrical signals.

As shown in FIG. 7, a test switching circuit that connects a plurality of data lines DL1 to DLm with a single first test line TL1 at a ratio of m-to-1 during the test period may be disposed in the non-display area NDA of the display panel 110. The test switching circuit may include a first multiplexer that connects the plurality of data lines DL1 to DLm with the single first test line TL1 at the ratio of m-to-1. The first multiplexer may be implemented with a plurality of MOSFETs MOS arranged in the non-display area NDA. The first multiplexer of the test switching circuit includes first switching elements SW1 that are connected to the plurality of data fan-out lines FDL1 to FLDm, respectively, and connect or disconnect between the data fan-out lines FDL1 to FLDm and the data lines DL1 to DLm. In addition, the test switching circuit further includes second switching elements SW2 that connect source nodes (e.g., the data pads PD1) connected to the data fan-out lines FDL1 to FLDm with either the output terminal of the data driver 340 or the first test line TL1. Each of the first switching element SW1 and the second switching element SW2 may include at least one MOSFET MOS disposed in the MOSFET layer 501. The first switching element SW1 and the second switching element SW2 may be associated with the data lines DL1 to DLm, respectively.

During the test period, the first switching elements SW1 may be sequentially turned on to connect the first data fan-out lines with the source nodes (e.g., the data pads PD1). At this time, the source nodes (e.g., the data pads PD1) are connected to the first test line TL1 by the second switching elements SW2 that are turned on in synchronization with the turn-on of the first switching elements SW1. Accordingly, the electric signals (e.g., a voltage or a current) generated from the pixel driver circuits PC may be transferred to the data fan-out lines FDL through the data lines DL. The electrical signals transferred to the data fan-out lines FDL may be read out to the first test line TL1 and the first test pad PD6 by turning on the first and second switching elements SW1 and SW2.

As such, the first test line TL1 may be sequentially connected to the data fan-out lines FDL by the switching operation of the test switching elements SW1 and SW2 during the test period. In other words, during the test period, by the switching operation of the test switching circuits SW1 and SW2, one of the plurality of data fan-out lines FDL and the first test line TL1 may be connected to each other. During the test period, the current or voltage of the first test line TL1 may be read out to the external test apparatus 710 through the first test pad PD6.

Figure 9:
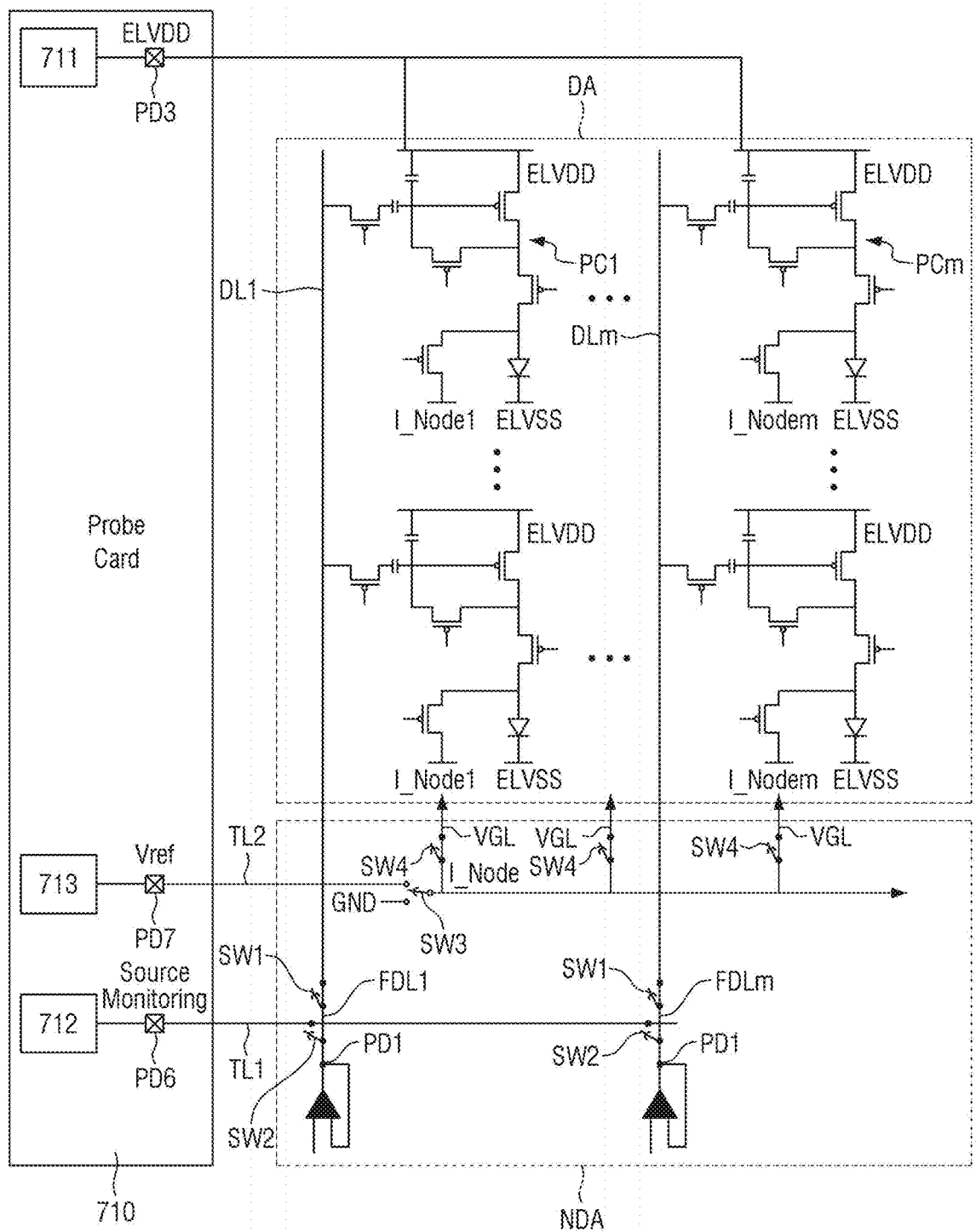
FIG. 9 is a view illustrating a method of switching between voltages of a third supply voltage line connected to each pixel during a test process.

FIG. 9 is a view illustrating a method of switching between voltages of a third supply voltage line connected to each pixel during a test process.

In FIG. 9, the same or substantially the same elements as those described above with reference to FIGS. 7 and 8 are denoted by the same reference symbols, and thus, redundant description thereof may not be repeated, and the differences may be mainly described in more detail hereinafter.

The embodiment of FIG. 9 may be different from the embodiment described above with reference to FIGS. 7 and 8 in that in FIG. 9, a second test line TL2 and a second test pad PD7 connected to the second test line TL2 may be further disposed in the non-display area NDA of the display panel 110. In addition, the embodiment of FIG. 9 may be different from the embodiment described above with reference to FIGS. 7 and 8 in that in FIG. 9, a third switching element SW3 and a fourth switching element SW4 may be further disposed in the non-display area NDA of the display panel 110 as elements (e.g., parts) of the test switching circuit.

Referring to FIG. 9, the third supply voltage line VGL may be connected to the ground potential GND while the display panel 110 displays images, and a voltage different from the ground potential GND may be provided during the period of inspecting for defects on the pixel driver circuits PC. The reference voltage Vref different from the ground potential GND may be applied to the third supply voltage line VGL during the period of inspecting for defects on the pixel driver circuits PC. Accordingly, the drain electrode of the fifth transistor T5 of each pixel PX connected to the third supply voltage line VGL (e.g., the I nodes I_Node1 to I_Nodem) may be connected to the ground potential GND while the display panel 110 displays images, and a voltage (e.g., the reference voltage Vref) different from the ground potential GND may be supplied thereto during a period of inspecting for defects on the pixel driver circuit PC.

By applying the reference voltage Vref different from the ground potential GND to the third supply voltage line VGL during the period of inspecting for defects on the pixel driver circuits PC, it may be possible to easily measure the electrical signals (e.g., a current or a voltage) related to the characteristics of the transistors T1, T2, T3, T4, and T5 included in the pixel driver circuits PC. If the fifth transistor T5 is connected to the ground potential GND during the test period, at least part of the electrical signals of each pixel PX may not be transferred to the test apparatus 710 through the test line TL1, and instead, may be discharged to the ground potential GND.

According to the embodiment illustrated in FIG. 9, the reference voltage Vref different from the ground potential GND is applied to the third supply voltage VGL during the test period in order to prevent or substantially prevent a part of the electrical signal from being discharged to the ground potential GND. As such, in the non-display area NDA of the display panel 110, the second test line TL2, the second test pad PD7 connected to the second test line TL2, and the third switching element SW3 and the fourth switching element SW4 for switching connections between the second test line TL2 and the third supply voltage line VGL may be disposed.

The test switching circuit includes the third switching element SW3 that connects the third supply voltage line VGL with either the ground potential GND or the second test line TL2. The third switching element SW3 connects the third supply voltage line VGL with the ground potential GND while the display panel 110 displays images. The third switching element SW3 connects the third supply voltage line VGL with the second test line TL2 during the test period. During the test period, the reference voltage Vref is applied from the outside (e.g., from the test apparatus 710) to the second test line TL2 through the second test pad PD7. Therefore, during the test period, the reference voltage Vref input from the outside (e.g., from the test apparatus 710) is applied to the third supply voltage line VGL through the second test pad PD7, and the drain electrode of the fifth transistor T5 of each of the pixel driver circuits PC (e.g., the I nodes I_Node1 to I_Nodem) may be connected to the reference voltage Vref. According to the present embodiment, during the period of inspecting for defects on the pixel driver circuits PC, an electrical signal (e.g., a current or a voltage) related to the characteristics of the transistors T1, T2, T3, T4, and T5 included in the pixel driver circuits PC is not discharged to the ground potential GND.

The test switching circuit may further include the fourth switching elements SW4 that are connected to the plurality of third supply voltage lines VGL connected to the columns of the pixels PX, respectively. The fourth switching elements SW4 may sequentially connect or disconnect between the third supply voltage lines VGL and the second test line TL2. The fourth switching elements SW4 may be associated with the third supply voltage lines VGL, respectively. During the test period, the fourth switching elements SW4 may be sequentially turned on to connect the third supply voltage lines VGL with the second test line TL2. The combination of the fourth switching elements SW4 connects the plurality of third supply voltage lines VGL with the single second test line TL2 at the ratio of m-to-1, and may be referred to as a second multiplexer. However, the present disclosure is not limited thereto, and the test switching circuit may not necessarily include the fourth switching elements SW4, such that the fourth switching elements SW4 may be omitted as needed or desired.

Figure 10:
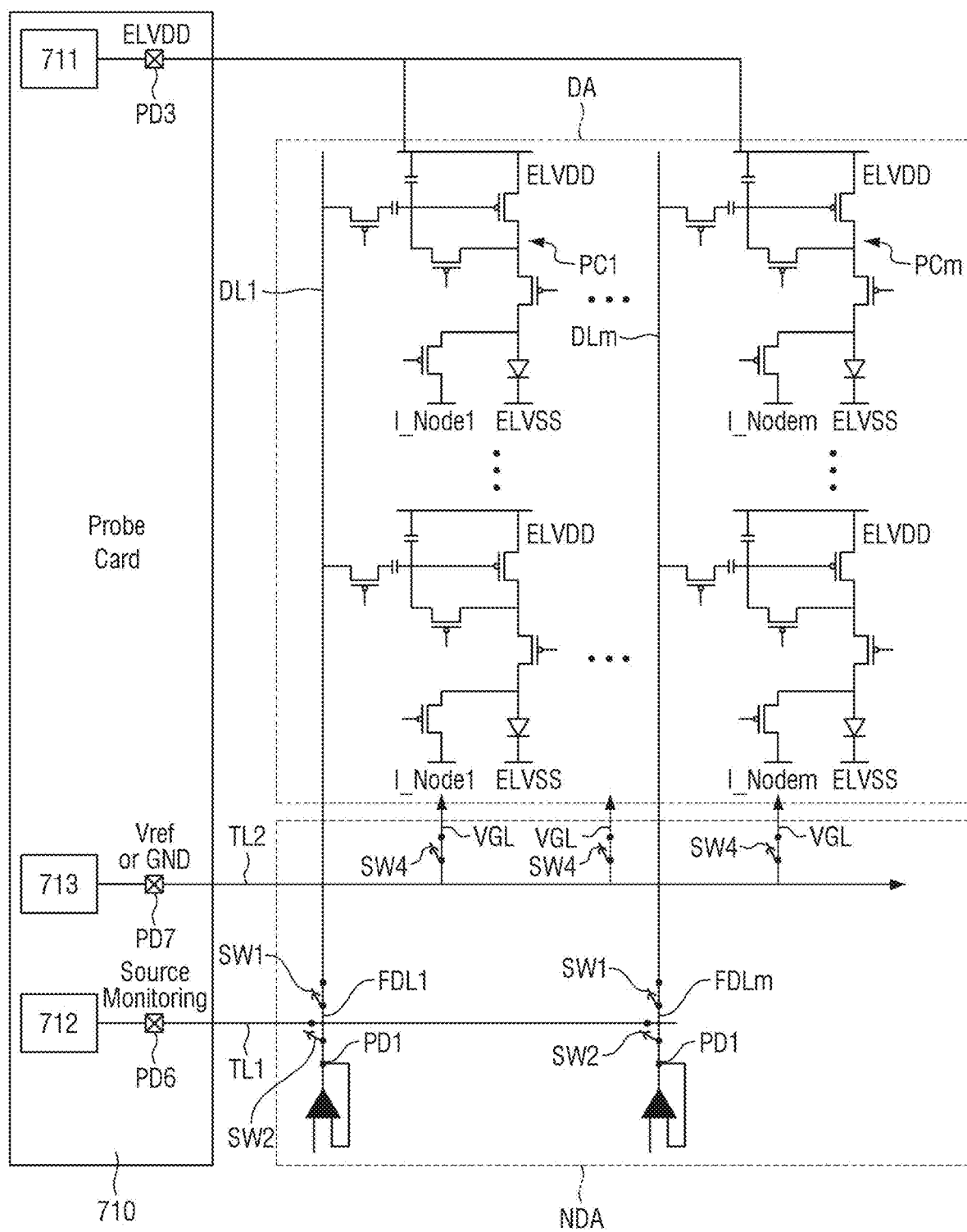
FIG. 10 is a view illustrating another method of switching between voltages of a third supply voltage line connected to each pixel during a test process.

FIG. 10 is a view illustrating another method of switching between voltages of a third supply voltage line connected to each pixel during a test process.

In FIG. 10, the same or substantially the same elements as those described above with reference to FIGS. 7 and 8 are denoted by the same reference symbols, and thus, redundant description thereof may not be repeated, and the differences may be mainly described in more detail hereinafter.

The embodiment of FIG. 10 may be different from the embodiment described above with reference to FIGS. 7 and 8 in that in FIG. 10, a second test line TL2 and a second test pad PD7 connected to the second test line TL2 may be further disposed in the non-display area NDA of the display panel 110. In addition, the embodiment of FIG. 10 may be different from the embodiment described above with reference to FIGS. 7 and 8 in that in FIG. 10, a fourth switching element SW4 may be further disposed in the non-display area NDA of the display panel 110 as an element (e.g., a part) of the test switching circuit.

Referring to FIG. 10, the third supply voltage lines VGL may be connected to the ground potential GND while the display panel 110 displays images, and a voltage different from the ground potential GND may be provided during the period of inspecting for defects on the pixel driver circuits PC. The reference voltage Vref different from the ground potential GND may be applied to the third supply voltage line VGL during the period of inspecting for defects on the pixel driver circuits PC. Accordingly, the drain electrode of the fifth transistor T5 of each pixel PX connected to the third supply voltage line VGL (e.g., the I nodes I_Node1 to I_Nodem) may be connected to the ground potential GND while the display panel 110 displays images, and a voltage (e.g., the reference voltage Vref) different from the ground potential GND may be supplied thereto during a period of inspecting for defects on the pixel driver circuit PC.

By applying the reference voltage Vref different from the ground potential GND to the third supply voltage line VGL during the period of inspecting for defects on the pixel driver circuits PC, it may be possible to easily measure the electrical signals (e.g., a current or a voltage) related to the characteristics of the transistors T1, T2, T3, T4, and T5 included in the pixel driver circuits PC. If the fifth transistor T5 is connected to the ground potential GND during the test period, at least part of the electrical signals of each pixel PX may not be transferred to the test apparatus 710 through the test line TL1, and instead, may be discharged to the ground potential GND.

According to the embodiment illustrated in FIG. 10, a reference voltage Vref different from the ground potential GND is applied to the third supply voltage VGL during the test period in order to prevent or substantially prevent a part of the electrical signal from being discharged to the ground potential GND. As such, in the non-display area NDA of the display panel 110, the second test line TL2, the second test pad PD7 connected to the second test line TL2, and the fourth switching element SW4 for switching connections between the second test line TL2 and the third supply voltage line VGL may be disposed.

The ground potential GND or the reference voltage Vref is applied to the second test pad PD7. The ground potential GND may be connected to the second test pad PD7 while the display panel 110 displays images. Accordingly, while the display panel 110 displays images, the second test line TL2 connected to the second test pad PD7 and the third supply voltage lines VGL connected to the second test line TL2 may be connected to the ground potential GND. On the other hand, during the test period, the reference voltage Vref may be applied from a second power supply unit or a second measurement unit (e.g., a second power supply or a second measurement circuit or device) 713 of the test apparatus 710. Accordingly, during the test period, the reference voltage Vref may be applied to the second test line TL2 connected to the second test pad PD7 and the third supply voltage lines VGL connected to the second test line TL2.

The test switching circuit may further include the fourth switching elements SW4 that are connected to the plurality of third supply voltage lines VGL connected to the columns of the pixels PX, respectively. The fourth switching elements SW4 may sequentially connect or disconnect between the third supply voltage lines VGL and the second test line TL2. The fourth switching elements SW4 may be associated with the third supply voltage lines VGL, respectively. During the test period, the fourth switching elements SW4 may be sequentially turned on to connect the third supply voltage lines VGL with the second test line TL2. The combination of the fourth switching elements SW4 connects the plurality of third supply voltage lines VGL with the single second test line TL2 at the ratio of m-to-1, and may be referred to as a second multiplexer. However, the present disclosure is not limited thereto, and the test switching circuit may not necessarily include the fourth switching elements SW4, such that the fourth switching elements SW4 may be omitted as needed or desired.

Figure 11:
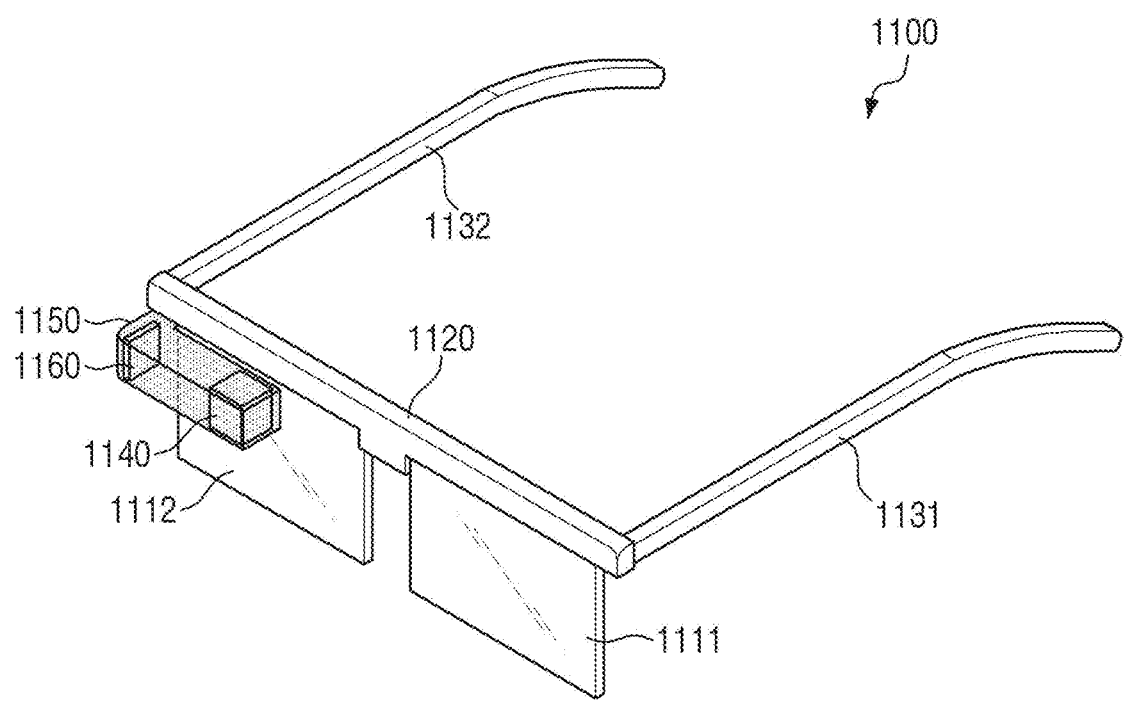
FIG. 11 is a perspective view showing an example of a virtual reality device including a display device according to an embodiment of the present disclosure.
Figure 12:
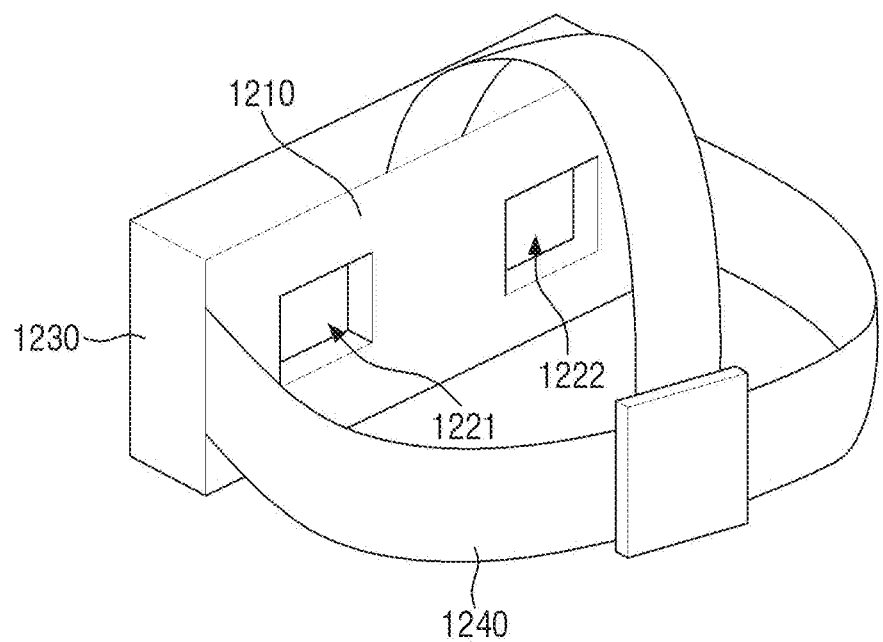
FIGS. 12 and 13 are views showing a head-mounted display device including a display device according to an embodiment of the present disclosure.
Figure 13:
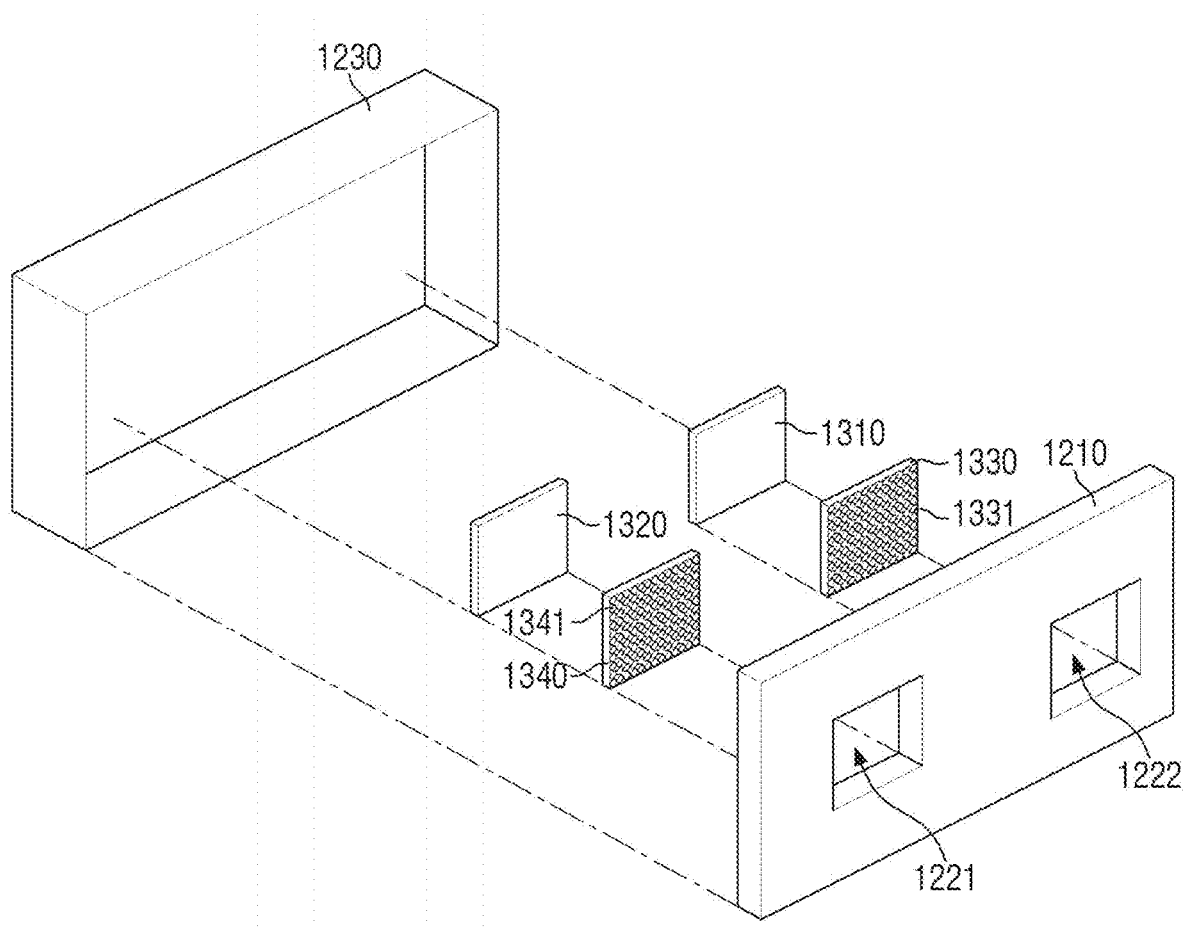

FIG. 11 is a perspective view showing an example of a virtual reality device including a display device according to an embodiment of the present disclosure. FIGS. 12 and 13 are views showing a head-mounted display device including a display device according to an embodiment of the present disclosure.

The display device 10 according to an embodiment may be included in a mobile electronic device. The display device 10 according to an embodiment may be included in a wearable device in the form of glasses or a helmet, and may form a focus at a location close to the user's eyes. For example, the wearable device may be a head mounted display (HMD) device or an AR glasses. Such a wearable device provides a user with an AR (augmented reality) screen or a VR (virtual reality) screen.

FIG. 11 shows an example of a virtual reality device including a display device according to an embodiment.

FIG. 11 shows a virtual reality device 1100 including a display device 1160 according to an embodiment. The display device 1160 may include, for example, the elements described above with reference to FIGS. 1 through 10.

Referring to FIG. 11, the virtual reality device 1100 according to the present embodiment may be AR glasses. The virtual reality device 1100 according to the present embodiment of the present disclosure may include the display device 1160, a left eye lens 1111, a right eye lens 1112, a support frame 1120, eyeglass temples 1131 and 1132, a reflective member 1140, and a display case 1150.

Although the virtual reality device 1100 is illustrated in the form of AR glasses in FIG. 11, the virtual reality device 1100 according to an embodiment may be applied to an HMD as well. In other words, the virtual reality device 1100 is not limited to that shown in FIG. 11, and may be applied in a variety of suitable mobile electronic devices in a variety of suitable forms.

The case 1150 may include the display device 1160 and the reflective member 1140. An image displayed on the display device 1160 may be reflected by the reflective member 1140, and provided to the user's right eye through the right eye lens 1112. Accordingly, the user may view a virtual reality image displayed on the display device 1160 through the user's right eye.

Although the case 1150 is disposed at the right end of the support frame 1120 in the example illustrated in FIG. 11, the present disclosure is not limited thereto. For example, the case 1150 may be disposed at the left end of the support frame 1120. In this case, images displayed on the display device 1160 may be reflected by the reflective member 1140, and provided to the user's left eye through the left eye lens 1111. Accordingly, the user may view a virtual reality image displayed on the display device 1160 through the user's left eye. As another example, a plurality of cases 1150 may be disposed at the left and right ends of the support frame 1120, respectively. In this case, the user may view a virtual reality image displayed on the display device 1160 through both the user's left and right eyes.

FIGS. 12 and 13 show examples of an HMD device including a display device according to an embodiment.

Referring to FIGS. 12 and 13, the display device 10 according to the present embodiment may be employed in an HMD device. The HMD device may include a first display device 1310 and a second display device 1320, each of which may be the display device 10 according to an embodiment. The first display device 1310 provides images to the user's right eye, and the second display device 1320 provides images to the user's left eye.

A first lens array 1330 may be disposed between the first display device 1310 and a case cover 1210. The first lens array 1330 may include a plurality of lenses 1331. The plurality of lenses 1331 may be formed as convex lenses having a convex toward the case cover 1210.

A second lens array 1340 may be disposed between the second display device 1320 and the case cover 1210. The second lens array 1340 may include a plurality of lenses 1341. The plurality of lenses 1341 may be formed as convex lenses having a convex toward the case cover 1210.

A case 1230 may accommodate the first display device 1310, the second display device 1320, the first lens array 1330, and the second lens array 1340. A surface of the case 1230 may be opened in order to accommodate the first display device 1310, the second display device 1320, the first lens array 1330, and the second lens array 1340.

The case cover 1210 is disposed to cover the opened surface of the case 1230. The case cover 1210 may include a first opening 1221 corresponding to the user's left eye, and a second opening 1222 corresponding to the user's right eye. Although the first opening 1221 and the second opening 1222 are formed in a rectangular shape in the example shown in FIGS. 12 and 13, the present disclosure is not limited thereto. The first opening 1221 and the second opening 1222 may be formed in a circular shape or an elliptical shape. As another example, the first opening 1221 and the second opening 1222 may be combined to form a single opening.

The first opening 1221 may be aligned with the first display device 1310 and the first lens array 1330, and the second opening 1222 may be aligned with the second display device 1320 and the second lens array 1340. Therefore, a user may view virtual images on the first display device 1310 magnified by the first lens array 1330 through the first opening 1221, and virtual images on the second display device 1320 magnified by the second lens array 1340 through the second opening 1222.

A head strap band 1240 may fix the case 1230 to the user's head, so that the first opening 1221 and the second opening 1222 of the case cover 1210 are in line with the user's left and right eyes, respectively. The head strap band 1240 may be connected to the top, left, and right sides of the case 1230.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present disclosure.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:
1. A display device comprising:
  a display panel comprising:
    a display area comprising a light-emitting element;
    a non-display area outside the display area;
    a semiconductor wafer substrate;
    a metal oxide semiconductor field effect transistor (MOSFET) layer on the semiconductor wafer substrate, and comprising:
      a pixel driver circuit configured to drive the light-emitting element; and a display driver circuit configured to control the pixel driver circuit;

at least one line layer on the MOSFET layer, and comprising:
a first supply voltage line, a second supply voltage line, gate lines,
and a data line connected to the pixel driver circuit;
gate fan-out lines in the non-display area, and connecting the gate lines with gate pads connected to a gate driver of the display driver circuit;
a data fan-out line in the non-display area, and connecting the data line with a data pad connected to a data driver of the display driver circuit;
a first supply voltage pad in the non-display area, and configured to supply a first supply voltage to the first supply voltage line;
a second supply voltage pad in the non-display area, and configured to supply a second supply voltage to the second supply voltage line;
a first test line in the non-display area, and connected to the data fan-out line by a switching operation of a test switching circuit, and
a first test pad in the non-display area, and connected to the first test line; and
a light-emitting element layer on the at least one line layer, and comprising the light-emitting element configured to be driven by the pixel driver circuit.

2. The display device of claim 1, wherein the test switching circuit is configured to be driven during a period of testing the pixel driver circuit.

3. The display device of claim 2, wherein during the period of testing the pixel driver circuit, the pixel driver circuit is configured to receive the first supply voltage through the first supply voltage line, the pixel driver circuit is configured to receive gate signals at a gate-on voltage through the gate lines, and the data fan-out line is configured to be connected to the first test line by the switching operation of the test switching circuit.

4. The display device of claim 3, wherein during the period of testing the pixel driver circuit, the first test pad is configured to transmit a current of the first test line or a voltage of the first test line to an external device.

5. The display device of claim 3, wherein the test switching circuit comprises:
a first switching element connected to the data fan-out line, and configured to connect or disconnect between the data fan-out line and the data line; and
a second switching element configured to connect a source node connected to the data fan-out line to either an output terminal of the data driver or the first test line.

6. The display device of claim 5, wherein each of the first switching element and the second switching element comprises at least one MOSFET in the MOSFET layer.

7. The display device of claim 5, wherein the pixel driver circuit comprises:
a first transistor comprising a gate electrode connected to a first node, a source electrode connected to the first supply voltage line, and a drain electrode connected to a second node;
a second transistor comprising a gate electrode connected to a first gate line from among the gate lines, a source electrode connected to the data line, and a drain electrode connected to the first node with a first capacitor therebetween;
a third transistor comprising a gate electrode connected to a second gate line from among the gate lines, a source electrode connected to the second node, and a drain electrode connected to the first node;
a fourth transistor comprising a gate electrode connected to an emission control line, a source electrode connected to the second node, and a drain electrode connected to a third node connected to the light-emitting element;
a fifth transistor comprising a gate electrode connected to a third gate line, a source electrode connected to the third node, and a drain electrode connected to a third supply voltage line; and
a second capacitor between the first supply voltage line and the first node.

8. The display device of claim 7, wherein each of the first to fifth transistors is a p-type MOSFET.

9. The display device of claim 7, wherein the third supply voltage line is configured to receive a ground potential while the display panel displays images.

10. The display device of claim 9, wherein the at least one line layer of the display panel further comprises:
a second test line in the non-display area, and connected to the third supply voltage line by the switching operation of the test switching circuit; and
a second test pad in the non-display area, and connected to the second test line.

11. The display device of claim 10, wherein the test switching circuit further comprises a third switching element configured to connect the third supply voltage line to either the ground potential or the second test line.

12. The display device of claim 11, wherein the third switching element is configured to connect the third supply voltage line with the second test line, and the second test line is configured to receive a reference voltage different from the ground potential during the period of testing the pixel driver circuit.

13. The display device of claim 12, wherein the test switching circuit further comprises a fourth switching element connected to the third supply voltage line, and configured to connect or disconnect between the third supply voltage line and the second test line.

14. The display device of claim 9, wherein the at least one line layer of the display panel further comprises:
a second test line in the non-display area, and connected to the third supply voltage line; and
a second test pad in the non-display area, and connected to the second test line.

15. The display device of claim 14, wherein during the period of testing the pixel driver circuit, the second test line is configured to receive a reference voltage having a level different from that of the ground potential through the second test pad, and the second test line is configured to be connected to the ground potential through the second test pad while the display panel displays images.

16. A method of fabricating a display device, the method comprising:
forming a MOSFET layer on a semiconductor wafer substrate, the MOSFET layer comprising:
pixel driver circuits to drive light-emitting elements; and
a display driver circuit to control the pixel driver circuits;
forming at least one line layer on the MOSFET layer;
applying, by a power supply of a test apparatus, a first supply voltage to a first supply voltage line through a first supply voltage pad;
connecting data fan-out lines connected to the pixel driver circuits with a first test line by controlling a test switching circuit in the MOSFET layer by a switching circuit of the test apparatus;

measuring, by a measuring circuit of the test apparatus, an electrical signal generated from each of the pixel driver circuits through a first test pad connected to the first test line;

determining, by a controller of the test apparatus, whether each of the pixel driver circuits is defective or not based on the measured electrical signal; and forming a light-emitting element layer comprising the light-emitting elements on the at least one line layer when the pixel driver circuits are determined to be not defective.

17. The method of claim 16, wherein the at least one line layer comprises:

the first supply voltage line, a second supply voltage line, gate lines, and data lines connected to the pixel driver circuits;

gate fan-out lines in a non-display area, and connecting the gate lines with gate pads connected to a gate driver of the display driver circuit;

the data fan-out lines in the non-display area, and connecting the data lines with data pads connected to a data driver of the display driver circuit;

the first supply voltage pad in the non-display area, and supplying the first supply voltage to the first supply voltage line;

a second supply voltage pad in the non-display area, and supplying a second supply voltage to the second supply voltage line;

the first test line in the non-display area, and connected to the data fan-out lines by a switching operation of the test switching circuit; and the first test pad in the non-display area, and connected to the first test line.

18. The method of claim 17, wherein the electrical signal comprises a voltage or a current generated from each of the pixel driver circuits.

19. The method of claim 17, wherein the test switching circuit comprises:

a first switching element connected to each of the data fan-out lines, and configured to connect or disconnect between the data fan-out lines and the data lines; and a second switching element configured to connect a source node connected to each of the data fan-out lines to either an output terminal of the data driver or the first test line.

20. The method of claim 19, wherein each of the first switching element and the second switching element comprises at least one MOSFET in the MOSFET layer.

* * * * *